US012813007B2

(12) United States Patent
Li et al.

(10) Patent No.: US 12,813,007 B2
(45) Date of Patent: Nov. 24, 2026

(54) SOLAR CELL AND PHOTOVOLTAIC MODULE

(71) Applicant: LONGI GREEN ENERGY TECHNOLOGY CO., LTD., Xi'an (CN)

(72) Inventors: Zhenguo Li, Xi'an (CN); Hongbo Tong, Xi'an (CN); Shengjie Deng, Xi'an (CN); Xuejian Zhang, Xi'an (CN); Long Yu, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/477,214

(22) PCT Filed: Jun. 6, 2025

(86) PCT No.: PCT/CN2025/099729
§ 371 (c)(1),
(2) Date: Oct. 21, 2025

(87) PCT Pub. No.: WO2025/256483
PCT Pub. Date: Dec. 18, 2025

(65) Prior Publication Data

US 2026/0123096 A1 Apr. 30, 2026

(30) Foreign Application Priority Data

Jun. 11, 2024 (CN) ......................... 202410752794.0

(51) Int. Cl.
*H10F 77/20* (2025.01)
*H10F 77/122* (2025.01)

(52) U.S. Cl.
CPC ......... *H10F 77/219* (2025.01); *H10F 77/122* (2025.01)

(58) Field of Classification Search
None
See application file for complete search history.

(56) References Cited

U.S. PATENT DOCUMENTS 9,508,884 B2 11/2016 Wenham et al.
2009/0266396 A1* 10/2009 Niira ....................... C01B 33/02 136/258

(Continued)

FOREIGN PATENT DOCUMENTS

CN 101673776 A 3/2010
CN 103545388 A 1/2014

(Continued)

OTHER PUBLICATIONS

English-language machine translation of CN 111509057 A. (Year: 2026).*

(Continued)

*Primary Examiner* — Eli S Mekhlin
(74) *Attorney, Agent, or Firm* — Fish & Richardson P.C.

(57) ABSTRACT

The present application relates to the field of photovoltaic technologies and provides a solar cell and a photovoltaic module. The solar cell includes: a silicon substrate, where the silicon substrate includes a first surface and a second surface that are opposite to each other; an N-type doped layer, formed on at least some regions of the first surface of the silicon substrate, where a sheet resistance of the N-type doped layer is 14 ohms/square to 40 ohms/square; and a plurality of N-type fingers distributed at intervals and in parallel, formed on a side of the N-type doped layer facing away from the silicon substrate, where a distance between adjacent N-type fingers is less than 1.391 mm.

10 Claims, 4 Drawing Sheets

(56) References Cited

U.S. PATENT DOCUMENTS

| | | | | |
|---|---|---|---|---|
| 2013/0025669 | A1 | 1/2013 | Sato et al. | |
| 2015/0380598 | A1 * | 12/2015 | Loscutoff | H10F 10/13 136/255 |
| 2016/0005903 | A1 * | 1/2016 | Wenham | H10F 10/146 438/87 |

FOREIGN PATENT DOCUMENTS

| | | | |
|---|---|---|---|
| CN | 111509057 | A | 4/2020 |
| CN | 111370504 | A | 7/2020 |
| CN | 111628049 | A | 9/2020 |
| CN | 111628050 | A | 9/2020 |
| CN | 117637892 | A | 3/2024 |
| CN | 118016767 | A | 5/2024 |
| CN | 118522791 | A | 8/2024 |
| CN | 120264857 | A | 7/2025 |
| JP | 2004259831 | A | 9/2004 |
| JP | 2020198380 | A | 12/2020 |
| KR | 10-2018-0050171 | A | 5/2018 |
| WO | 2012/081813 | A1 | 6/2012 |

OTHER PUBLICATIONS

International Search Report and Written Opinion in International Appln. No. PCT/CN2025/099729, mailed on Sep. 22, 2025, 21 pages (with machine translation).

Office Action in Chinese Appln. No. 202410752794.0, mailed on Oct. 1, 2024, 12 pages (with English translation).

Office Action in Australian Appln. No. 2025238106, mailed on Nov. 21, 2025, 9 pages.

Extended European Search Report in European Appln. No. 25811898.3, mailed on Oct. 16, 2026, 12 pages.

* cited by examiner

SOLAR CELL AND PHOTOVOLTAIC MODULE

CROSS-REFERENCE TO RELATED APPLICATIONS

This application is a 371 national stage application of PCT Application No. PCT/CN2025/099729, filed on Jun. 6, 2025, which claims priority to Chinese Patent Application No. 202410752794.0, filed on Jun. 11, 2024. The disclosures of the aforementioned applications are hereby incorporated by reference in their entireties.

TECHNICAL FIELD

The present application relates to the field of photovoltaic technologies, and in particular, to a solar cell and a photovoltaic module.

BACKGROUND

Solar cells can convert solar energy into electric energy, and utilize clean energy, so that the solar cells have a wide application prospect.

The function of converting the solar energy into the electric energy can be desirably implemented in need of collaboration between various factors in the solar cell. However, in the existing solar cell, collaboration between factors is not proper enough, leading to poor performance of the solar cell.

SUMMARY

The present application provides a solar cell and a photovoltaic module, to resolve the problem that in the existing solar cell, collaboration between different factors is not proper enough, leading to poor performance of the solar cell.

According to a first aspect of the present application, a solar cell is provided, including:

a silicon substrate, where the silicon substrate includes a first surface and a second surface that are opposite to each other;

an N-type doped layer, formed on at least some regions of the first surface of the silicon substrate, where a sheet resistance of the N-type doped layer ranges from 14 ohms/square to 40 ohms/square; and a plurality of N-type fingers distributed at intervals and in parallel, formed on a side of the N-type doped layer facing away from the silicon substrate, where a distance between adjacent N-type fingers is less than 1.391 mm.

In this embodiment of the present application, the sheet resistance of the N-type doped layer ranges from 14 ohms/square to 40 ohms/square, the distance between adjacent N-type fingers is less than 1.391 mm, and the sheet resistance of the N-type doped layer and the distance between adjacent N-type fingers are respectively within the foregoing ranges, so that factors such as parasitic absorption, a recombination current of a metal region, and a transverse resistance can achieve a better balance, thereby achieving better performance of the solar cell and higher photoelectric conversion efficiency.

In some possible embodiments, the sheet resistance of the N-type doped layer ranges from 14 ohms/square to 20 ohms/square, and the distance between adjacent N-type fingers ranges from 1.019 mm to 1.296 mm; or the sheet resistance of the N-type doped layer is greater than 20 ohms/square and less than or equal to 40 ohms/square, and the distance between adjacent N-type fingers ranges from 0.839 mm to 0.977 mm.

In some possible embodiments, a thickness of the N-type doped layer ranges from 100 nm to 140 nm.

In some possible embodiments, a doping concentration of the N-type doped layer ranges from $3\times10^{20}$ $cm^{-3}$ to $7\times10^{20}$ $cm^{-3}$.

In some possible embodiments, the solar cell further includes: a P-type doped layer, where a sheet resistance of the P-type doped layer ranges from 20 ohms/square to 166 ohms/square; and a plurality of P-type fingers distributed at intervals and in parallel, formed on a side of the P-type doped layer facing away from the silicon substrate.

In some possible embodiments, the N-type doped layer includes: an N-type doped polysilicon layer and/or an N-type doped microcrystalline silicon layer:

the solar cell further includes: a first tunneling oxide layer, formed between the N-type doped layer and the silicon substrate; and a distance between adjacent P-type fingers is less than or equal to the distance between adjacent N-type fingers.

In some possible embodiments, the first surface has: a first conductive region and a second conductive region that are distributed at an interval:

the N-type doped layer is formed on the first conductive region;

the P-type doped layer is formed on the second conductive region; and the solar cell further includes: a second tunneling oxide layer, formed between the P-type doped layer and the silicon substrate.

In some possible embodiments, the N-type doped layer is formed on the first surface of the silicon substrate, and the P-type doped layer is formed on the second surface of the silicon substrate.

In some possible embodiments, the P-type doped layer is a P-type doped polysilicon layer and/or a P-type doped microcrystalline silicon layer.

According to a second aspect of the present application, a solar cell is provided, including:

a silicon substrate, where the silicon substrate includes a light-receiving surface and a back surface that are opposite to each other;

an N-type doped layer, formed on the back surface of the silicon substrate, where a thickness of the N-type doped layer ranges from 100 nm to 140 nm;

a plurality of N-type fingers distributed at intervals and in parallel, formed on a side of the N-type doped layer facing away from the silicon substrate, where a distance between adjacent N-type fingers is less than 1.391 mm;

a P-type doped layer, formed on the light-receiving surface of the silicon substrate; and a plurality of P-type fingers distributed at intervals and in parallel, formed on a side of the P-type doped layer facing away from the silicon substrate, where a distance between adjacent P-type fingers is less than or equal to the distance between adjacent N-type fingers.

In the present application, the N-type doped layer is formed on the back surface of the silicon substrate, and the thickness of the N-type doped layer ranges from 100 nm to 140 nm, which is beneficial to factors in several aspects, such as a sheet resistance, parasitic absorption, a recombination current of a passivated region, and a recombination current of a metal region, of the N-type doped layer, so that the performance of the solar cell is better, and the photoelectric conversion efficiency is higher. In addition, the distance between adjacent N-type fingers is less than 1.391 mm, so that factors such as parasitic absorption, a recombination current of a metal region, and a transverse resistance can achieve a better balance, thereby achieving better performance of the solar cell and higher photoelectric conversion efficiency. In addition, the distance between adjacent P-type fingers is less than or equal to the distance between adjacent N-type fingers. Specifically, because the P-type doped layer does not easily obtain a relatively high doping concentration, the distance between adjacent P-type fingers may be smaller, which can further improve the efficiency of the solar cell.

According to a third aspect of the present application, a solar cell is provided, including:

a silicon substrate, where the silicon substrate includes a light-receiving surface and a back surface that are opposite to each other;

the back surface has: a first conductive region and a second conductive region that are distributed at an interval;

an N-type doped layer, formed on the first conductive region, where a sheet resistance of the N-type doped layer is greater than 14 ohms/square and less than or equal to 40 ohms/square;

a P-type doped layer, formed on the second conductive region, where a sheet resistance of the P-type doped layer ranges from 20 ohms/square to 166 ohms/square;

a plurality of N-type fingers distributed at intervals and in parallel, formed on a side of the N-type doped layer facing away from the silicon substrate, where a distance between adjacent N-type fingers is less than 1.391 mm.

In the present application, the N-type doped layer and the P-type doped layer are both formed on the back surface of the silicon substrate. The sheet resistance of the N-type doped layer ranges from 14 ohms/square to 40 ohms/square, the distance between adjacent N-type fingers is less than 1.391 mm, and the sheet resistance of the N-type doped layer and the distance between adjacent N-type fingers are respectively within the foregoing ranges, so that factors such as parasitic absorption, a recombination current of a metal region, and a transverse resistance can achieve a better balance, thereby achieving better performance of the solar cell and higher photoelectric conversion efficiency. That the sheet resistance of the P-type doped layer falls within this range is beneficial to improving efficiency of the solar cell.

According to a fourth aspect of the present application, a photovoltaic module is provided. The photovoltaic module includes a plurality of solar cell strings, the solar cell string includes a plurality of solar cells and a plurality of interconnection members, and the interconnection members are configured to connect the plurality of solar cells in series; and the solar cells include a plurality of solar cells according to any one of the foregoing aspects.

The above solar cell and photovoltaic module have the same or similar beneficial effects, and in order to avoid repetition, no more details will be given here.

The foregoing descriptions are merely an overview of the technical solutions in the present application. In order that technical solutions of the present application can be understood more clearly so that the technical solutions can be implemented according to content of this specification, and in order that the foregoing and other objectives, features, and advantages of the present application can be understood more clearly, specific implementations of the present application are described below:

BRIEF DESCRIPTION OF THE DRAWINGS

To describe the technical solutions in embodiments of the present application or in the related art more clearly, the accompanying drawings required for describing the embodiments or the related art are briefly described below. Apparently, the accompanying drawings in the following descriptions show some embodiments of the present application, and a person of ordinary skill in the art may still derive other drawings from these accompanying drawings without creative efforts.

REFERENCE NUMERALS

Figure 1:
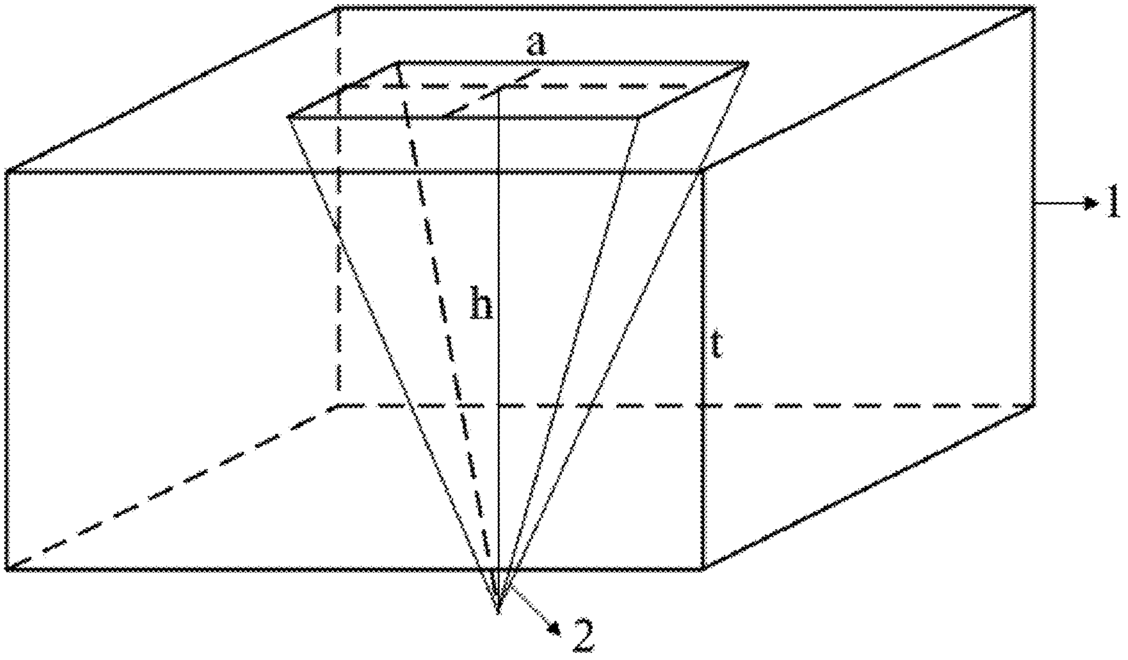
FIG. 1 is a schematic diagram of a partial structure of a solar cell according to an embodiment of the present application.

1—N-type doped layer, 2—N-type finger, 3—silicon substrate, 4—first tunneling oxide layer, 5—P-type doped layer, 6—P-type finger, 7—first passivation anti-reflection layer, 8—second passivation anti-reflection layer, and 9—second tunneling oxide layer.

DETAILED DESCRIPTION

To make the objectives, technical solutions, and advantages of embodiments of the present application clearer, the following clearly and completely describes the technical solutions in the embodiments of the present application with reference to the accompanying drawings in the embodiments of the present application. Apparently, the described embodiments are some of the embodiments of the present application rather than all the embodiments. All other embodiments obtained by those of normal skill in the art based on the embodiments of the present application without involving any creative effort shall fall within the scope of protection of the present application.

A person skilled in the art should understand that in the disclosure of the present application, terms "first", "second", "third", "fourth", "fifth", and the like are only used to distinguish different structures, and do not limit a quantity, a connection relationship, and the like of specific structures. In addition, orientation or position relationships indicated by "longitudinal", "transverse", "above", "below", "front", "back", "left", "right", "vertical", "horizontal" "top", "bottom", "inside", and "outside" are based on orientation or position relationships shown in the accompanying drawings, and are used only for ease and brevity of illustration and description of the present application, rather than indicating or implying that the mentioned apparatus or component needs to have a particular orientation or needs to be constructed and operated in a particular orientation. Therefore, the foregoing terms should not be construed as limiting of the present application.

The present application provides at least three solar cells, and the foregoing several solar cells are explained and described subsequently mainly from a first aspect, a second aspect, and a third aspect. A solar cell of the first aspect here corresponds to the solar cell of the first aspect in the foregoing application content. A solar cell of the second aspect here corresponds to the solar cell of the second aspect in the foregoing application content. A solar cell of the third aspect here corresponds to the solar cell of the third aspect in the foregoing application content. In the solar cell of the first aspect, the N-type doped layer may be formed on the entire first surface of the silicon substrate, or the N-type doped layer may be formed on a part of the first surface of the silicon substrate. In the solar cell of the second aspect, the N-type doped layer may be formed on the back surface of the silicon substrate, the P-type doped layer is formed on the light-receiving surface of the silicon substrate, and the solar cell is a bifacial solar cell. A specific type of the solar cell of the second aspect is not limited. For example, the solar cell of the second aspect may be bifacial Tunnel Oxide Passivated Contact (TOPCon) solar cell. In the solar cell of the third aspect, the N-type doped layer and the P-type doped layer may both be formed on the back surface of the silicon substrate, and the solar cell is a back contact solar cell. A specific type of the solar cell of the third aspect is not limited. For example, the solar cell of the third aspect may be a TBC (a combination of TOPCon and IBC) solar cell.

Before the solar cell in the first aspect is described, some related content in the solar cells in the three aspects is roughly described first. In the design of a solar cell, a recombination and a series resistance are two core factors that affect efficiency, and the performance needs to be improved by collaboratively optimizing parameters. Therefore, in a solar cell, when the series resistance is a main influencing factor, the low sheet resistance needs to be adjusted to lower the series resistance and improve the electrical conductivity. In a solar cell, if the recombination is a main factor, reduction of a doping concentration or depth needs to be considered, leading to a high sheet resistance, and consequently, the carrier recombination is reduced. Specifically to the design of doped layers in a solar cell, for each of an N-type doped layer and a P-type doped layer, a thickness thereof may be usually related to a corresponding sheet resistance thereof, and an approximate relationship is: When the N-type doped layer or the P-type doped layer has an excessively small thickness, an excessively high sheet resistance may be caused, and a transverse current transport capability may be reduced, affecting the efficiency of the solar cell; and when the N-type doped layer or the P-type doped layer has an excessively large thickness, a light absorption loss may be further increased. Therefore, the thickness of the N-type doped layer or the P-type doped layer and factors such as parasitic absorption, doping, and a sheet resistance need to be comprehensively considered. In a solar cell, for each of an N-type doped layer and a P-type doped layer, a doping concentration thereof may be usually related to a corresponding sheet resistance thereof, and an approximate relationship is: The doping concentration of the N-type doped layer or the doping concentration of the P-type doped layer is approximately inversely proportional to the sheet resistance. That is, a higher doping concentration indicates a lower sheet resistance. However, an excessively low doping concentration causes a poor passivation effect and a high contact resistance; and an excessively high doping concentration causes severe parasitic absorption, and an increase in Auger recombination. Therefore, the doping concentration of the N-type doped layer or the doping concentration of the P-type doped layer and factors such as a sheet resistance, a passivation effect, and parasitic absorption also need to be comprehensively considered. In a solar cell, a finger is used for collecting a current or carriers, and a distance between fingers is closely related to factors such as recombination in carrier transport and light shielding. In the present application, for different parameters, related factors are comprehensively considered, and a result of optimizing and balancing is selected as much as possible. Therefore, in the solar cell in the present application, the factors collaborate with each other properly, thereby improving the performance of the solar cell.

It should be noted that, to avoid repetition, only differences from the solar cell of the first aspect are mainly described in the solar cells of the second aspect and the third aspect, and for each part the same as or related to that of the solar cell of the first aspect, reference may be made to the related record of the first aspect.

The following starts to describe the solar cell of the first aspect. The solar cell of the first aspect may include: a silicon substrate. The doping type, the crystal type, and the like of the silicon substrate are not specifically limited. For example, the silicon substrate may be N-type doped monocrystalline silicon. The silicon substrate includes a first surface and a second surface that are opposite to each other. One of the first surface and the second surface is a light-receiving surface, and the other is a back surface. In a normal working process of the solar cell, a surface mainly receiving illumination is the light-receiving surface, and the back surface is opposite to the light-receiving surface.

The solar cell may further include: an N-type doped layer. The N-type doped layer and the foregoing silicon substrate may form a high-low junction or a PN junction, which is not specifically limited. The N-type doped layer is formed on at least some regions of the first surface of the silicon substrate, and may be formed on the entire first surface, or may be formed on only some regions of the first surface. This is not specifically limited. A sheet resistance of the N-type doped layer ranges from 14 ohms/square (Ω/□) to 40 ohms/square. The sheet resistance of the N-type doped layer is: For a part that is in the N-type doped layer and whose length is 1, width is w; and height is d (that is, the thickness of the N-type doped layer), in this case, $L=1$ and $S=w\times d$ for this part, and therefore $Rsh=\rho\times l/(w\times d)=(\rho/d)\times(l/w)$. It is set that $l=w$: Therefore, $Rsh=(\rho/d)$, where $\rho$ is the resistivity of the N-type doped layer. In this case, Rsh is the sheet resistance of the N-type doped layer. The square herein refers to a region that is in the N-type doped layer and that has a length equal to a width and has a variable thickness. When the length and the width of the square are equal, the magnitudes of the length and the width substantially do not affect the magnitude of the sheet resistance. For example, when the length and the width of the square are equal, the length and the width may be one centimeter or one meter, and correspond to an equal sheet resistance. However, the sheet resistance decreases as the thickness of the square increases.

The solar cell may further include: a plurality of N-type fingers distributed at intervals and in parallel, formed on a side of the N-type doped layer facing away from the silicon substrate. The N-type finger is used for collecting carriers. As shown in FIG. 1, 1 schematically indicates an N-type doped layer, and 2 schematically indicates an N-type finger. The quantity of N-type fingers 2 in the solar cell is not specifically limited. In FIG. 1, a silicon substrate is formed on an upper side of the N-type doped layer, the N-type finger 2 is inserted into the N-type doped layer 1, and a distance between adjacent N-type fingers 2 is less than 1.391 mm (millimeter). The distance between adjacent N-type fingers 2 is a distance between two N-type fingers 2 disposed next to each other. In this embodiment of the present application, the sheet resistance of the N-type doped layer ranges from 14 ohms/square to 40 ohms/square, the distance between adjacent N-type fingers is less than 1.391 mm, and the sheet resistance of the N-type doped layer and the distance between adjacent N-type fingers are respectively within the foregoing ranges, so that factors such as parasitic absorption, a recombination current of a metal region, and a transverse resistance can achieve a better balance, thereby achieving better performance of the solar cell and higher photoelectric conversion efficiency.

For example, the sheet resistance of the N-type doped layer may be 14 ohms/square, 14.7 ohms/square, 15 ohms/square, 16.8 ohms/square, 17.6 ohms/square, 18.5 ohms/square, 19.3 ohms/square, 20.4 ohms/square, 22 ohms/square, 25 ohms/square, 23.1 ohms/square, 29.5 ohms/square, 27 ohms/square, 30 ohms/square, 32.5 ohms/square, 38 ohms/square, 39.1 ohms/square, or 40 ohms/square, and the distance between adjacent N-type fingers may be 1.296 mm, 1.213 mm, 1.141 mm, 1.076 mm, 1.019 mm, 1 mm, 0.977 mm, 0.967 mm, 0.92 mm, 0.878 mm, 0.839 mm, or 0.8 mm.

Figure 2:
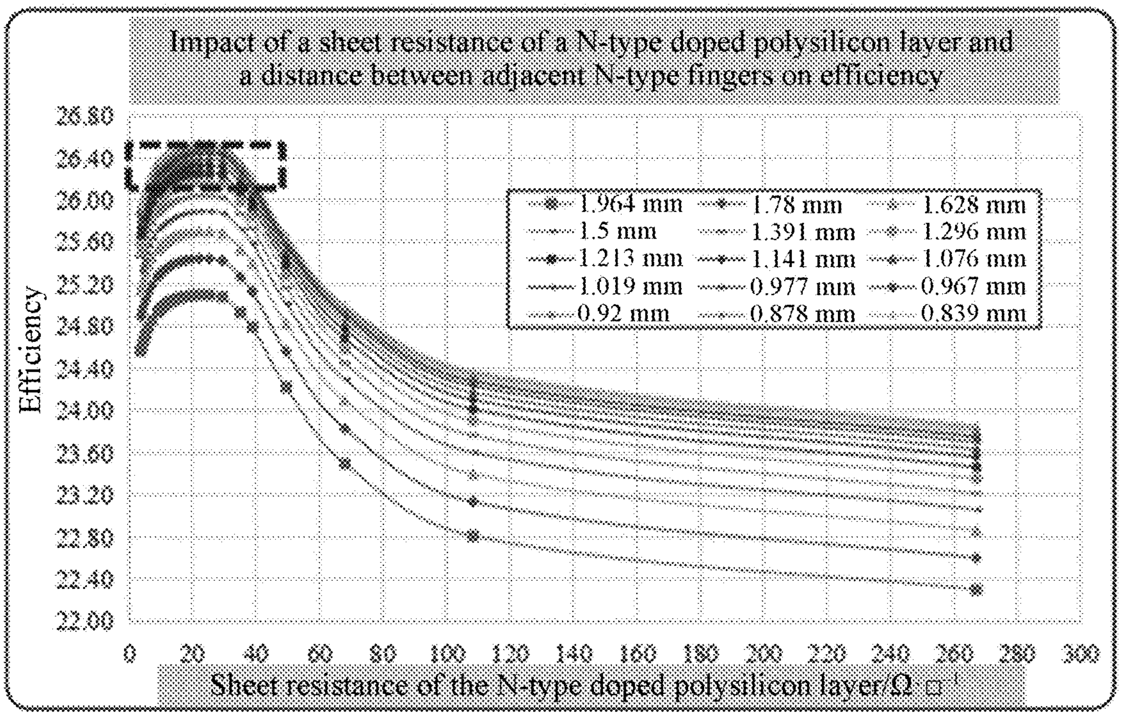
FIG. 2 is a curve graph of impact of a sheet resistance of an N-type doped layer and a distance between adjacent N-type fingers on efficiency of a solar cell according to an embodiment of the present application.

More specifically; FIG. 2 is a curve graph of impact of a sheet resistance of an N-type doped layer and a distance between adjacent N-type fingers on efficiency of a solar cell. For example, referring to FIG. 2, a horizontal coordinate in FIG. 2 indicates a sheet resistance of an N-type doped layer such as an N-type doped polysilicon layer or a phosphorus-doped polysilicon layer, and a vertical coordinate in FIG. 2 indicates efficiency of the solar cell. Curves from bottom to top in FIG. 2 sequentially correspond to the following distances between adjacent N-type fingers: a total of 15 distances of 1.964 mm, 1.78 mm, 1.628 mm, 1.5 mm, 1.391 mm, 1.296 mm, 1.213 mm, 1.141 mm, 1.076 mm, 1.019 mm, 0.977 mm, 0.967 mm, 0.92 mm, 0.878 mm, and 0.839 mm. In FIG. 2, a solar cell whose efficiency is greater than or equal to 26%, for example, 26.0% to 26.5%, is selected as a relatively efficient solar cell, that is, a part bounded by a dashed box in FIG. 2, and efficiency of each solar cell corresponding to a part below the dashed box is less than 26%. It may be learned from FIG. 2 that, efficiency of each of solar cells corresponding to distances between adjacent N-type fingers greater than or equal to 1.391 mm being such 5 distances as 1.964 mm, 1.78 mm, 1.628 mm, 1.5 mm, and 1.391 mm among the foregoing 15 distances between adjacent N-type fingers, and/or the sheet resistance of the N-type doped layer being less than 14 ohms/square or greater than 40 ohms/square is less than 26%, indicating that when the distance between adjacent N-type fingers is greater than or equal to 1.391 mm, and/or the sheet resistance of the N-type doped layer is less than 14 ohms/square or greater than 40 ohms/square, the solar cell cannot obtain good efficiency. Therefore, in the present application, the distance between adjacent N-type fingers being less than 1.391 mm and the sheet resistance of the N-type doped layer ranging from 14 ohms/square to 40 ohms/square are selected, which is beneficial to improvement of efficiency of a solar cell. As shown in FIG. 2, in the present application, if the distance between adjacent N-type fingers being less than 1.391 mm and the sheet resistance of the N-type doped layer ranging from 14 ohms/square to 40 ohms/square are selected, efficiency of the solar cell is greater than or equal to 26%, and even reaches 26.5% or higher.

In some possible embodiments, the sheet resistance of the N-type doped layer ranges from 14 ohms/square to 20 ohms/square, and the distance between adjacent N-type fingers ranges from 1.019 mm to 1.296 mm; or the sheet resistance of the N-type doped layer is greater than 20 ohms/square and less than or equal to 40 ohms/square, and the distance between adjacent N-type fingers ranges from 0.839 mm to 0.977 mm. Specifically, referring to FIG. 2, the sheet resistance of the N-type doped layer is 20 ohms/square, and is approximately a sheet resistance of the N-type doped layer corresponding to an inflection point of the efficiency in a part whose efficiency is greater than or equal to 26%. More specifically, when the sheet resistance of the N-type doped layer ranges from 14 ohms/square to 20 ohms/square, the distance between adjacent N-type fingers ranges from 1.019 mm to 1.296 mm, the efficiency of each solar cell is greater than or equal to 26.0%, and the rate at which the efficiency increases is the highest; and when the sheet resistance of the N-type doped layer is greater than 20 ohms/square and less than or equal to 40 ohms/square, the distance between adjacent N-type fingers ranges from 0.839 mm to 0.977 mm, the efficiency of each solar cell is greater than or equal to 26.0%, and the rate at which the efficiency decreases is the lowest. Therefore, in the present application, the sheet resistance of the N-type doped layer ranges from 14 ohms/square to 20 ohms/square, and the distance between adjacent N-type fingers ranges from 1.019 mm to 1.296 mm; or the sheet resistance of the N-type doped layer is greater than 20 ohms/square and less than or equal to 40 ohms/square, and the distance between adjacent N-type fingers ranges from 0.839 mm to 0.977 mm. The sheet resistance of the N-type doped layer and the distance between adjacent N-type fingers are further combined and optimized, thereby further improving the efficiency of the solar cell. It should be noted that a material of the N-type finger is not specifically limited. For example, the N-type finger may be a silver finger.

For example, the sheet resistance of the N-type doped layer may be 14 ohms/square, 14.7 ohms/square, 15 ohms/square, 15.3 ohms/square, 16 ohms/square, 16.5 ohms/square, 17 ohms/square, 17.7 ohms/square, 18 ohms/square, 18.5 ohms/square, 19 ohms/square, 19.5 ohms/square, or 20 ohms/square, and the distance between adjacent N-type fingers may be 1.019 mm, 1.05 mm, 1.076 mm, 1.112 mm, 1.141 mm, 1.173 mm, 1.213 mm, 1.25 mm, or 1.296 mm. Alternatively, the sheet resistance of the N-type doped layer may be 20.3 ohms/square, 20.7 ohms/square, 21 ohms/square, 21.3 ohms/square, 22 ohms/square, 22.5 ohms/square, 23 ohms/square, 23.5 ohms/square, 24 ohms/square, 24.5 ohms/square, 25 ohms/square, 25.6 ohms/square, 27 ohms/square, 28 ohms/square, 29.6 ohms/square, 30 ohms/square, 31.6 ohms/square, 36.2 ohms/square, 38.56 ohms/square, or 40 ohms/square, and the distance between adjacent N-type fingers may be 0.977 mm, 0.971 mm, 0.967 mm, 0.9 mm, 0.92 mm, 0.913 mm, 0.878 mm, 0.8 mm, or 0.839 mm.

Figure 3:
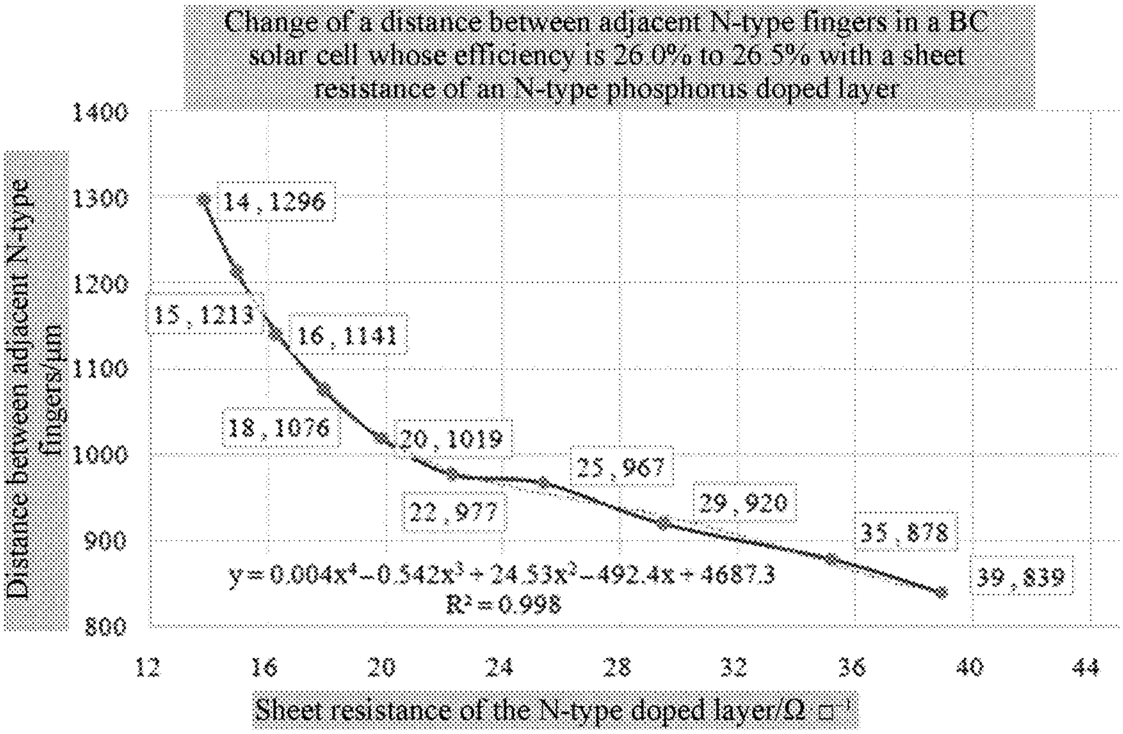
FIG. 3 is a fitted curve graph of a sheet resistance of an N-type doped layer and a distance between adjacent N-type fingers according to an embodiment of the present application.

More specifically, a fitted curve between the distance y between adjacent N-type fingers and the sheet resistance x of the N-type doped layer in the back contact solar cell (BC) obtained by performing fitting with reference to related data in a case that the efficiency of the solar cell is greater than or equal to 26.0%, such as 26.0% to 26.5% in FIG. 2 is shown in FIG. 3, that is, $y=0.004x^4-0.542x^3+24.53x^2-492.4x+4687.3$. The correlation degree of the fitted curve is $R^2$=0.998, and in the fitted curve or the fitted formula, a unit of y is micrometer (μm), and a unit of x is ohms/square. In FIG. 3, each point includes data formed on the left and data formed on the right. In each point, the data on the left is the sheet resistance of the N-type doped layer, and the data on the right is the distance between adjacent N-type fingers corresponding to the sheet resistance. A combination of the distance between adjacent N-type fingers and the sheet resistance of the N-type doped layer obtained from the fitted curve enables factors such as parasitic absorption, a recombination current of a metal region, and a transverse resistance to achieve a better balance, thereby achieving better performance of the solar cell and higher photoelectric conversion efficiency.

Figure 4:
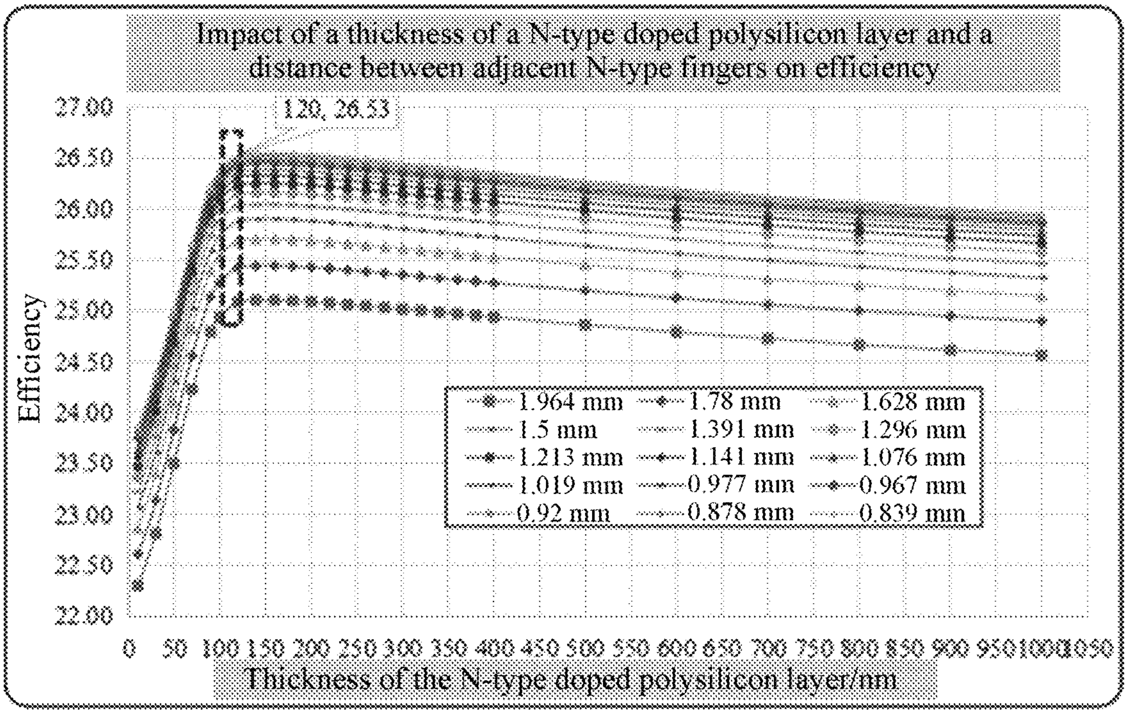
FIG. 4 is a curve graph of impact of a thickness of an N-type doped layer and a distance between adjacent N-type fingers on efficiency of a solar cell according to an embodiment of the present application.

In some possible embodiments, the N-type doped layer has a thickness of 100 nm (nanometer) to 140 nm. The N-type doped layer has a proper thickness, which is beneficial to factors in several aspects, such as a sheet resistance, parasitic absorption, a recombination current of a passivated region, and a recombination current of a metal region, of the N-type doped layer, so that the performance of the solar cell is better, and the photoelectric conversion efficiency is higher. More specifically, referring to FIG. 1, a side wall of the N-type finger 2 is in contact with the N-type doped layer 1. A larger height h and a larger side length a of the bottom surface of the N-type finger 2 indicates a larger area of the side wall of the N-type finger 2 and a larger recombination current of the metal region. Assuming that a recombination velocity of the side wall of the N-type finger 2 is 107 cm/s, a weighted average value of a recombination current of the metal region and a recombination current of the passivated region according to an area ratio is estimated, to obtain a recombination current of a macroscopic metal region. When the height h of the N-type finger 2 is fixed, the thickness of the N-type doped layer 1 is changed to t, and a recombination current of the metal region is estimated. FIG. 4 is a curve graph of impact of a thickness of an N-type doped layer and a distance between adjacent N-type fingers on efficiency of a solar cell. Curves from bottom to top in FIG. 4 sequentially correspond to the following distances between adjacent N-type fingers: a total of 15 distances of 1.964 mm, 1.78 mm, 1.628 mm, 1.5 mm, 1.391 mm, 1.296 mm, 1.213 mm, 1.141 mm, 1.076 mm, 1.019 mm, 0.977 mm, 0.967 mm, 0.92 mm, 0.878 mm, and 0.839 mm. In FIG. 4, each point includes data formed on the left and data formed on the right. In the point, the data on the left is the thickness of the N-type doped layer, and the data on the right is the corresponding efficiency of the solar cell at the thickness. It may be learned according to FIG. 4 that, when the thickness of the N-type doped layer ranges from 100 nm to 140 nm, particularly, approximately 120 nm, for the foregoing 15 distances between adjacent N-type fingers, the efficiency of each solar cell substantially reaches a maximum. In addition, when the thickness of the N-type doped layer is less than 100 nm, the efficiency of each solar cell is increased as the thickness of the N-type doped layer is increased. In addition, when the thickness of the N-type doped layer is greater than 140 nm, the efficiency of the solar cell keeps stable or tends to decrease as the thickness of the N-type doped layer increases. In addition, when the thickness of the N-type doped layer ranges from 100 nm to 140 nm, the recombination current of the metal region estimated in the foregoing manner is also relatively small. Therefore, in the present application, the N-type doped layer has a thickness of 100 nm to 140 nm, which is beneficial to factors in several aspects, such as a sheet resistance, parasitic absorption, a recombination current of a passivated region, and a recombination current of a metal region, of the N-type doped layer, so that the performance of the solar cell is better, and the photoelectric conversion efficiency is higher. For example, if the thickness of the N-type doped layer being 120 nm is selected, a formula $$R_{sh} = \frac{1}{q\mu nt}$$

is used. The sheet resistance Rsh of the N-type doped layer is roughly estimated, and it is learned through calculation that the sheet resistance Rsh of the N-type doped layer is approximately 29.5 ohms/square, and falls within the foregoing range of 14 ohms/square to 40 ohms/square. In the foregoing formula, q is an elementary charge, q=1.6021766208×$10^{-19}$ coulombs, μ is a migration rate (a drift rate of a carrier in a unit electric field strength) and is approximately 35.27 $cm^2$/V·s. N is a doping concentration of the N-type doped layer and is approximately 5×1020 $cm^{-3}$, and t is a thickness of the N-type doped layer, that is, 120 nm.

For example, the thickness of the N-type doped layer may be 100 nm, 103.2 nm, 105 nm, 109 nm, 110 nm, 115 nm, 118.3 nm, 120 nm, 125 nm, 128 nm, 130 nm, 132.3 nm, 135 nm, 137.9 nm, or 140 nm.

In some possible embodiments, the N-type doped layer has a doping concentration of $3\times10^{20}$ $cm^{-3}$ to $7\times10^{20}$ $cm^{-3}$. Specifically, the doping concentration of the N-type doped layer is an important factor affecting the sheet resistance of the N-type doped layer. In the present application, the doping concentration of the N-type doped layer is limited within a relatively proper range, so that the sheet resistance of the N-type doped layer can fall within the foregoing required range.

For example, the doping concentration of the N-type doped layer may be $3\times 10^{20}$ $cm^{-3}$, $3.2\times10^{20}$ $cm^{-3}$, $3.5\times10^{20}$ $cm^{-3}$, $4\times10^{20}$ $cm^{-3}$, $4.3\times10^{20}$ $cm^{-3}$, $4.7\times10^{20}$ $cm^{-3}$, $4.21\times 10^{20}$ $cm^{-3}$, $5\times10^{20}$ $cm^{-3}$, $5.2\times10^{20}$ $cm^{-3}$, $5.5\times10^{20}$ $cm^{-3}$, $6\times10^{20}$ $cm^{-3}$, $6.3\times10^{20}$ $cm^{-3}$, or $7\times10^{20}$ $cm^{-3}$.

In some possible embodiments, the solar cell further includes: a P-type doped layer, where the P-type doped layer and the silicon substrate form a PN junction or a high-low junction, a sheet resistance of the P-type doped layer ranges from 20 ohms/square to 166 ohms/square, and the sheet resistance of the P-type doped layer is defined as follows: for a part that is in the P-type doped layer and whose length is 1, width is w; and height is d (that is, the thickness of the P-type doped layer), in this case, L=1 and S=w×d for this part, and therefore Rsh=ρ×l/(w×d)=(ρ/d)×(l/w). It is set that l=w. Therefore, Rsh=(ρ/d), where ρ is the resistivity of the P-type doped laver. In this case, Rsh is the sheet resistance of the P-type doped layer. The sheet resistance of the P-type doped layer falling within the range is beneficial to improving the efficiency of the solar cell, for example, causing the efficiency of the solar cell to be greater than or equal to 25.99%, and the solar cell further includes: a plurality of P-type fingers distributed at intervals and in parallel, formed on a side of the P-type doped layer facing away from the silicon substrate, where the P-type finger is used for collecting carriers.

Figure 5:
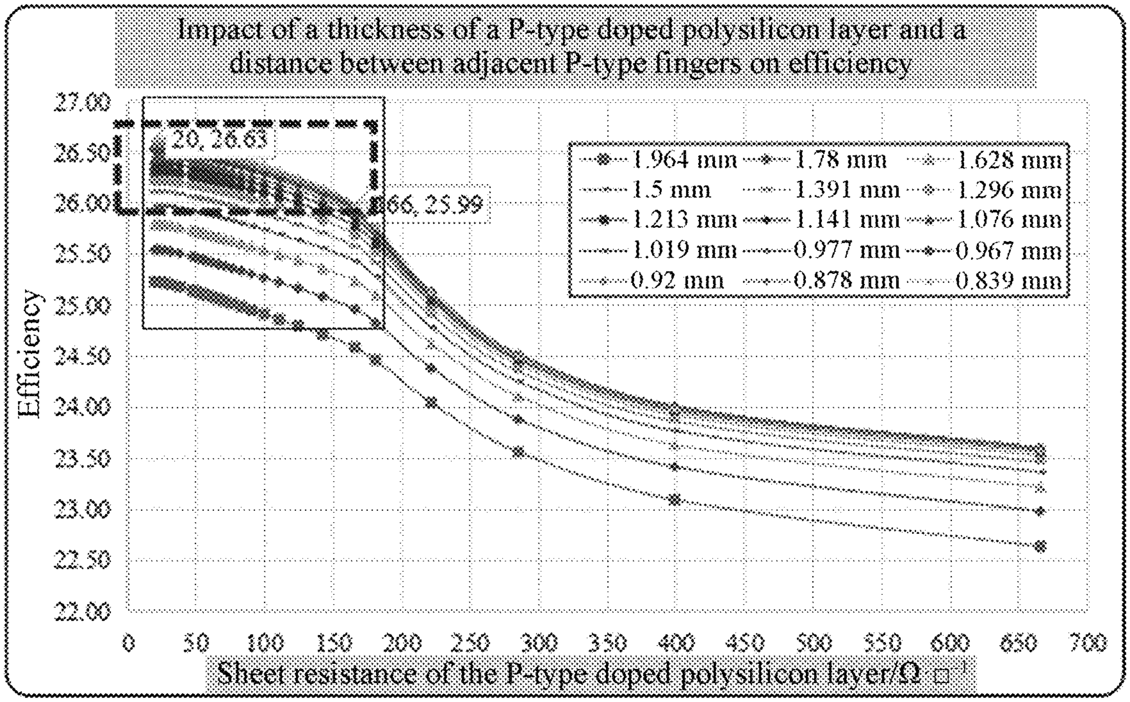
FIG. 5 is a curve graph of impact of a sheet resistance of a P-type doped layer and a distance between adjacent P-type fingers on efficiency of a solar cell according to an embodiment of the present application.

More specifically, referring to the following FIG. 5, FIG. 5 is a curve graph of impact of a sheet resistance of a P-type doped layer such as a boron doped polysilicon layer and a distance between adjacent P-type fingers on efficiency of a solar cell. A horizontal coordinate in FIG. 5 indicates a sheet resistance of a P-type doped layer such as a P-type doped polysilicon layer or a boron-doped polysilicon layer, and a vertical coordinate in FIG. 5 indicates efficiency of the solar cell. Curves from bottom to top in FIG. 5 sequentially correspond to the following distances between adjacent P-type fingers: a total of 15 distances of 1.964 mm, 1.78 mm, 1.628 mm, 1.5 mm, 1.391 mm, 1.296 mm, 1.213 mm, 1.141 mm, 1.076 mm, 1.019 mm, 0.977 mm, 0.967 mm, 0.92 mm, 0.878 mm, and 0.839 mm. In FIG. 5, efficiency of a solar cell corresponding to a part bounded by a dashed box is greater than or equal to 25.99%, and efficiency of each solar cell corresponding to a part outside the box is less than 25.99%. It may be learned from FIG. 5 that, when the sheet resistance of the P-type doped layer ranges from 20 ohms/square to 166 ohms/square, each performance of the solar cell is relatively good, and the efficiency of the solar cell is relatively high, reaching 25.99% or higher. In FIG. 5, data of each of two points includes data formed on the left and data formed on the right. The data on the left is the sheet resistance of the P-type doped layer, and the data on the right is the corresponding efficiency of the solar cell at the sheet resistance. In the present application, by limiting matching between factors such as the sheet resistance of the N-type doped layer and the sheet resistance of the P-type doped layer, a relatively large distance between fingers can be properly selected in the solar cell, thereby reducing unit consumption of a finger.

For example, the sheet resistance of the P-type doped layer may be 20 ohms/square. 20.5 ohms/square, 36 ohms/square, 40 ohms/square, 50 ohms/square, 60 ohms/square, 70 ohms/square. 80 ohms/square. 90 ohms/square, 93 ohms/square. 100 ohms/square, 120 ohms/square, 130 ohms/square, 140 ohms/square, 150 ohms/square, 160 ohms/square, or 166 ohms/square.

In some possible embodiments, the N-type doped layer includes: an N-type doped polysilicon layer and/or an N-type doped microcrystalline silicon layer, and the solar cell further includes: a first tunneling oxide layer, formed between the N-type doped layer and the silicon substrate. The first tunneling oxide layer and the foregoing N-type doped layer may form a passivated contact structure, thereby further improving the efficiency of the solar cell. The distance between adjacent P-type fingers is less than or equal to the distance between adjacent N-type fingers. Specifically, because the P-type doped layer does not easily obtain a relatively high doping concentration, the distance between adjacent P-type fingers may be smaller, which can further improve the efficiency of the solar cell. When the distance between adjacent P-type fingers is less than the distance between adjacent N-type fingers, a difference between the two distances is not specifically limited. It should be noted that a material of the P-type finger is not specifically limited, and whether the material of the P-type finger is the same as the material of the N-type finger is not specifically limited either. For example, the P-type finger may be a silver finger.

In some possible embodiments, the first surface of the foregoing silicon substrate has: a first conductive region and a second conductive region that are distributed at an interval. An interval between the first conductive region and the second conductive region is used for avoiding electric leakage, and relative sizes of the first conductive region and the second conductive region are not limited. The N-type doped layer is formed on the first conductive region, the P-type doped layer is formed on the second conductive region, and the solar cell may further include: a second tunneling oxide layer, formed between the P-type doped layer and the silicon substrate. The second tunneling oxide layer and the first tunneling oxide layer may be formed in a same process, or the second tunneling oxide layer and the first tunneling oxide layer may be formed in different processes. This is not specifically limited. When the second tunneling oxide layer and the first tunneling oxide layer are formed in different processes, whether the first tunneling oxide layer or the second tunneling oxide layer is first formed is not specifically limited. For example, the first tunneling oxide layer may be first formed, and then the second tunneling oxide layer may be formed. The first surface herein may be a back surface of the silicon substrate, and therefore the solar cell is a back contact solar cell. The light-receiving surface of the silicon substrate in the solar cell is not covered by an electrode, which has higher efficiency.

In some possible embodiments, the foregoing N-type doped layer may be formed on the first surface of the silicon substrate, or the N-type doped layer covers the entire first surface of the silicon substrate; and the P-type doped layer is formed on the second surface of the silicon substrate, or the P-type doped layer covers the entire second surface of the silicon substrate. The solar cell is a bifacial solar cell, and the solar cell is diversified in type. One of the first surface and the second surface herein is a light-receiving surface, and the other is a back surface. For example, the silicon substrate may be N-type doped monocrystalline silicon. The N-type doped layer is an N-type doped polysilicon layer, the N-type doped polysilicon layer may be formed on the back surface of the silicon substrate, the P-type doped layer is a P-type doped polysilicon layer, the P-type doped polysilicon layer is formed on the light-receiving surface of the silicon substrate, and the first tunneling oxide layer is further disposed between the N-type doped layer and the silicon substrate. The solar cell may further include a film layer such as an anti-reflection layer, and other film layers included in the solar cell are not specifically limited.

In some possible embodiments, the P-type doped layer is a P-type doped polysilicon layer and/or a P-type doped microcrystalline silicon layer, or a P-type diffusion layer, and the P-type doped layer is diversified.

The solar cell in the first aspect of the present application is further explained below with reference to specific examples.

The solar cell is a back contact solar cell. The silicon substrate is N-type doped monocrystalline silicon. The first surface of the silicon substrate is a back surface. The first surface has a first conductive region and a second conductive region that are distributed at an interval. An interval between the first conductive region and the second conductive region is used for avoiding electric leakage. The N-type doped layer is an N-type doped polysilicon layer, the P-type doped layer is a P-type doped polysilicon layer, the N-type doped polysilicon layer is formed on the first conductive region, and the P-type doped polysilicon layer is formed on the second conductive region. A doping element in the N-type doped polysilicon layer includes phosphorus, and a doping element in the P-type doped layer includes boron. The second tunneling oxide layer is further disposed between the P-type doped polysilicon layer and the silicon substrate. The first tunneling oxide layer is further disposed between the N-type doped polysilicon layer and the silicon substrate. The sheet resistance of the N-type doped polysilicon layer is 24 ohms/square. The sheet resistance of the P-type doped polysilicon layer is 59 ohms/square. The distance between adjacent N-type fingers is 0.9 mm. The distance between adjacent P-type fingers is also 0.9 mm. Various solar cell performance parameters of the back contact solar cell are measured. Refer to the following table for a measurement result and the foregoing parameters of the back contact solar cell.

Table of parameters of the back contact solar cell

| Sheet resistance of the N-type doped polysilicon layer/Ω · □$^{-1}$ | Sheet resistance of the P-type doped polysilicon layer/Ω · □$^{-1}$ | Distance between adjacent fingers/mm | Eta/% | Voc (V) | Jsc (mA/cm$^2$) | FF |
|---|---|---|---|---|---|---|
| 24 | 59 | 0.9 | 26.50 | 0.7453 | 42.09 | 84.48 |

In the foregoing table, Eta is efficiency of the back contact solar cell, Voc is an open circuit voltage of the back contact solar cell, Jsc is a short circuit current density of the back contact solar cell, and FF is a fill factor of the back contact solar cell. The efficiency of the back contact solar cell is as high as 26.5%, and the main reason is that in the back contact solar cell, such parameters as the sheet resistance of the N-type doped polysilicon layer, the sheet resistance of the P-type doped polysilicon layer, the distance between adjacent N-type fingers, and the distance between adjacent P-type fingers collaborate with each other, so that factors such as parasitic absorption, a recombination current of a metal region, and a transverse resistance in the back contact solar cell achieve a better balance, thereby achieving better performance of the solar cell and higher photoelectric conversion efficiency.

Before the solar cell of the second aspect and the solar cell of the third aspect are described, two common key features in structures of the solar cell of the second aspect and the solar cell of the third aspect are first summarized. First, a sheet resistance of a P-type doped layer 5 is greater than a sheet resistance of an N-type doped layer 1. Second, a doping concentration of the P-type doped layer 5 is less than a doping concentration of the N-type doped layer 1. This setting can optimize a process rhythm, improve process efficiency, and the like. In addition, when the silicon substrate is an N-type silicon substrate, the P-type doped layer 5 and the N-type silicon substrate form a PN junction or an emitter junction, to separate electrons and holes, the N-type doped layer 1 and the N-type silicon substrate form a high-low junction, to accelerate collection of electrons, that the sheet resistance of the P-type doped layer 5 is greater than the sheet resistance of the N-type doped layer 1 can reduce contact recombination of the PN junction or the emitter junction, and That the doping concentration of the P-type doped layer 5 is less than the doping concentration of the N-type doped layer 1 reduces parasitic absorption and Auger recombination at the emitter junction, and facilitates carrier generation; and for the high-low junction, that the N-type doped layer 1 has a smaller sheet resistance can increase transport and collection of majority carriers, and that the N-type doped layer 1 has a higher doping concentration makes a contact resistance between a doped layer collecting majority carriers and an electrode smaller. Therefore, in the present application, the PN junction and the high-low junction are both optimized and balanced, thereby further improving the conversion efficiency of the solar cell.

Figure 6:
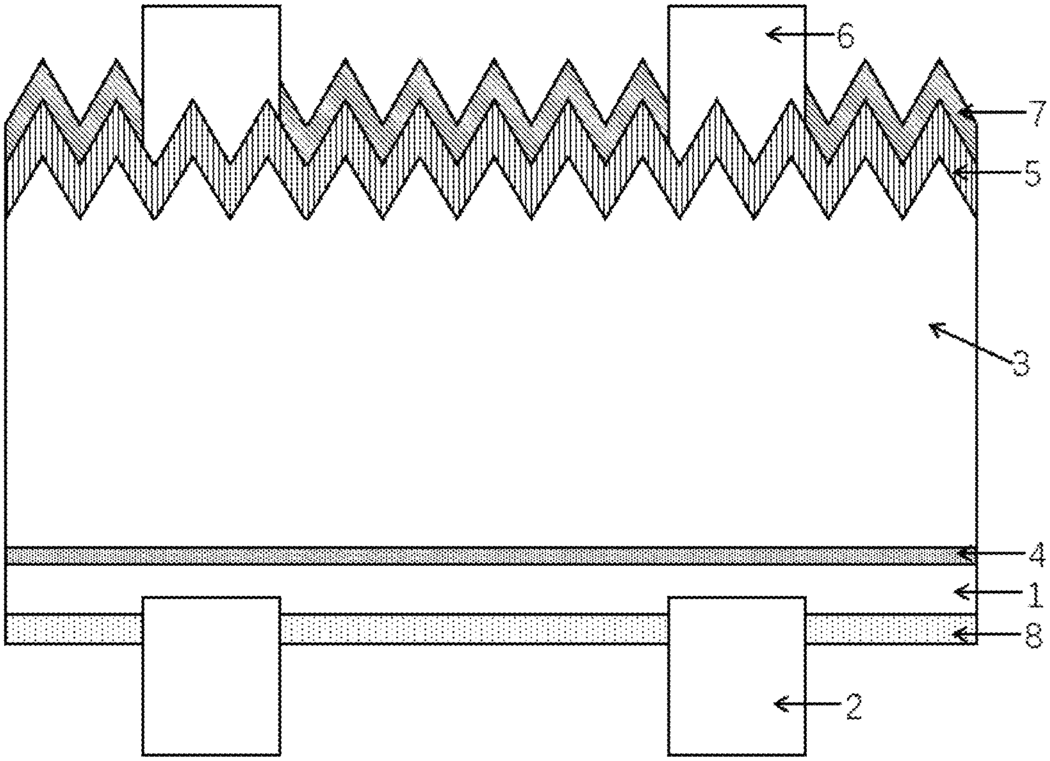
FIG. 6 to FIG. 8 are schematic diagram of structures of a plurality of solar cells according to embodiments of the present application.
Figure 7:
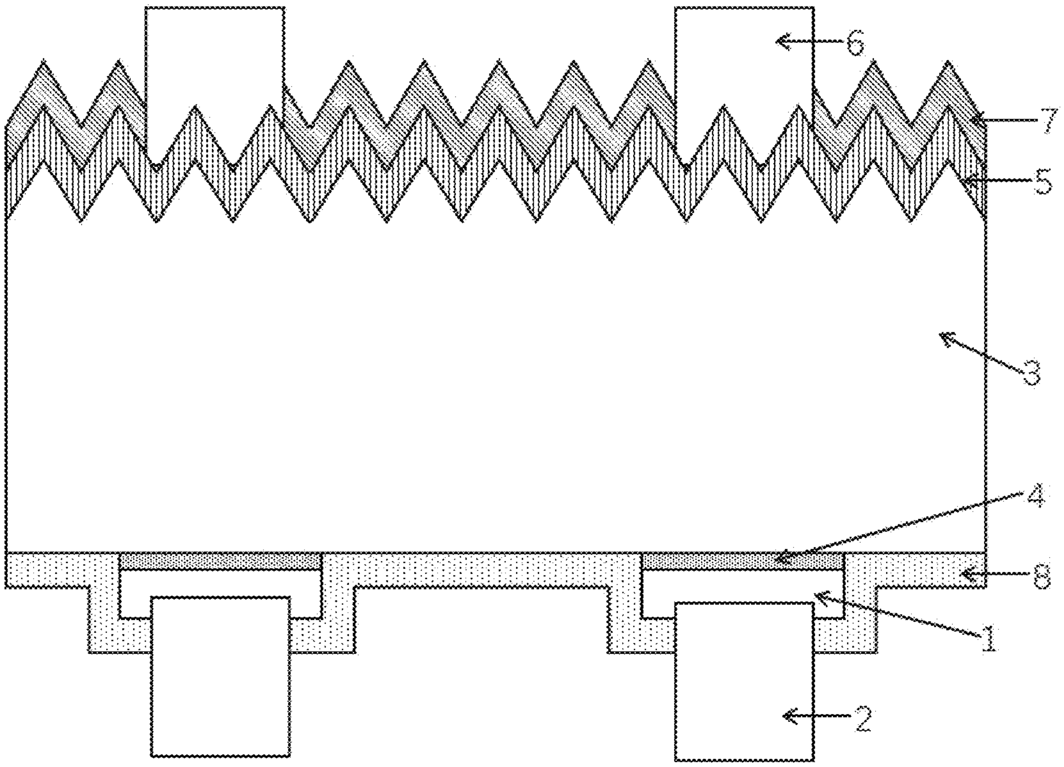

Referring to FIG. 6 and FIG. 7, the following starts to describe the solar cell according to the second aspect. For related parts of the solar cell of the second aspect, refer to related records of the solar cell of the foregoing first aspect. To avoid repetition, only differences from the solar cell of the first aspect are described. The solar cell of the second aspect may be a bifacial TOPCon solar cell.

The solar cell of the second aspect includes: a silicon substrate 3, an N-type doped layer 1, an N-type finger 2, a P-type doped layer 5, and a P-type finger 6. The doping type, the crystal type, and the like of the silicon substrate are not specifically limited. For example, the silicon substrate may be N-type doped monocrystalline silicon. In FIG. 6 to FIG. 7, a lower surface of the silicon substrate 3 is a back surface, and an upper surface is a light-receiving surface.

The N-type doped layer 1 is formed on the back surface of the silicon substrate 3. The N-type doped layer 1 and the foregoing silicon substrate 3 may form a high-low junction or a PN junction, which is not specifically limited. Referring to FIG. 6, the N-type doped layer 1 may be formed on the entire back surface of the silicon substrate 3. In some embodiments, referring to FIG. 7, the N-type doped layer 1 may be formed on only some regions of the back surface of the silicon substrate 3. For example, the N-type doped layer 1 may be formed on only some regions of the back surface of the silicon substrate 3 in a form of a finger structure. The N-type doped layer 1 has a thickness of 100 nm (nanometer) to 140 nm. The N-type doped layer 1 has a proper thickness, which is beneficial to factors in several aspects, such as a sheet resistance, parasitic absorption, a recombination current of a passivated region, and a recombination current of a metal region, of the N-type doped layer 1, so that the performance of the solar cell is better, and the photoelectric conversion efficiency is higher. More specifically, referring to FIG. 1, a side wall of the N-type finger 2 is in contact with the N-type doped layer 1. A larger height h and a larger side length a of the bottom surface of the N-type finger 2 indicates a larger area of the side wall of the N-type finger 2 and a larger recombination current of the metal region. Assuming that a recombination velocity of the side wall of the N-type finger 2 is 107 cm/s, a weighted average value of a recombination current of the metal region and a recombination current of the passivated region according to an area ratio is estimated, to obtain a recombination current of a macroscopic metal region. When the height h of the N-type finger 2 is fixed, the thickness of the N-type doped layer 1 is changed to t, and a recombination current of the metal region is estimated. For related descriptions of the specific reason, refer to the foregoing FIG. 4 and the foregoing related record about FIG. 4. Details are not described herein again.

The solar cell may further include: a plurality of N-type fingers distributed at intervals and in parallel, formed on a side of the N-type doped layer 1 facing away from the silicon substrate 3. The N-type finger is used for collecting carriers. Reference may be made to the foregoing related record. To avoid repetition, details are not described herein again. A distance between adjacent N-type fingers 2 is less than 1.391 mm (millimeter). The distance between adjacent N-type fingers 2 is a distance between two N-type fingers 2 disposed next to each other. The distance between adjacent N-type fingers is less than 1.391 mm, and the distance between adjacent N-type fingers falls within the foregoing range, so that factors such as parasitic absorption, a recombination current of a metal region, and a transverse resistance can achieve a better balance, thereby achieving better performance of the solar cell and higher photoelectric conversion efficiency. For specific reasons and related records, refer to the foregoing FIG. 2 and related records. Details are not described herein again.

For example, the distance between adjacent N-type fingers may be 1.296 mm, 1.213 mm, 1.141 mm, 1.076 mm, 1.019 mm, 1 mm, 0.977 mm, 0.967 mm, 0.92 mm, 0.878 mm, 0.839 mm, 0.8 mm, or 0.65 mm.

The P-type doped layer 5 is formed on the light-receiving surface of the silicon substrate 3. That is, in the solar cell of the second aspect, the N-type doped layer 1 is formed on the back surface of the silicon substrate 3, the P-type doped layer 5 is formed on the light-receiving surface of the silicon substrate 3. The solar cell is a bifacial solar cell, and another structure of the solar cell is not limited. The P-type doped layer 5 and the silicon substrate 3 form a PN junction or a high-low junction. The P-type doped layer 5 may cover the entire light-receiving surface or a part of the light-receiving surface of the silicon substrate 3. This is not limited. For example, the silicon substrate 3 may be N-type doped monocrystalline silicon, the N-type doped layer 1 is an N-type doped polysilicon layer, the N-type doped polysilicon layer is formed on the back surface of the silicon substrate 3, the P-type doped layer 5 is a boron diffusion layer or a P-type doped polysilicon layer, and The P-type doped layer is formed on the light-receiving surface of the silicon substrate 3. A first tunneling oxide layer 4 is further disposed between the N-type doped layer 1 and the silicon substrate 3. The solar cell may further include: a first passivation anti-reflection layer 7 formed on a side of the P-type doped layer 5 facing away from the silicon substrate, and a second passivation anti-reflection layer 8 formed on a side of the N-type doped layer 1 facing away from the silicon substrate, and other film layers included in the solar cell are not specifically limited. Specific materials of the first passivation anti-reflection layer 7 and the second passivation anti-reflection layer 8 are not limited, and whether the materials of the two passivation anti-reflection layers are the same is not specifically limited either. For example, each of the first passivation anti-reflection layer 7 and the second passivation anti-reflection layer 8 may be a mixture of aluminum oxide and silicon nitride, or one of the two passivation anti-reflection layers may be a silicon nitride layer.

The solar cell may further include: a plurality of P-type fingers 6 distributed at intervals and in parallel, formed on a side of the P-type doped layer 5 facing away from the silicon substrate 3, where the P-type finger 6 is used for collecting carriers. A distance between adjacent P-type fingers 6 is less than or equal to the distance between adjacent N-type fingers. Specifically, in a solar cell, recombination and series resistance are two major influencing factors. For a bifacial TOPCon solar cell, recombination has a severer impact on the solar cell. The main reasons are as follows: First, the P-type doped layer 5 of the TOPCon solar cell is formed on a light-receiving side of the silicon substrate 3, and is formed by boron diffusion of the silicon substrate. Compared with recombination brought by diffusion of the N-type doped layer 1 into the silicon substrate through the first tunneling oxide layer 4, recombination brought by diffusion of the P-type doped layer 5 into the silicon substrate is severer. Meanwhile, a higher doping concentration of the P-type doped layer 5 indicates deeper doping, a larger degree of diffusion of the P-type doped layer 5 into the silicon substrate, and a severer recombination. Therefore, to reduce the degree of diffusion of the P-type doped layer 5 into the silicon substrate, or to reduce the degree of recombination, in the present application, the doping concentration and the junction depth of the P-type doped layer 5 are properly controlled, to make the doping concentration of the P-type doped layer 5 lower and the junction depth smaller. Such a design causes the sheet resistance of the P-type doped layer 5 to be large, and a transverse carrier transport capability to be reduced. To improve the transverse carrier transport capability: in the present application, the distance between adjacent P-type fingers 6 is properly reduced, thereby shortening a transverse carrier transport distance, and effectively offsetting a bad impact caused by a large sheet resistance of the P-type doped layer 5, so as to further improve efficiency of the solar cell. Second, because the P-type doped layer 5 is made through a boron diffusion process, compared with the phosphorus diffusion process of the N-type doped layer 1, the boron diffusion process is more difficult. If a relatively high doping concentration is intended to be obtained, a long-process high-temperature process is needed, which negatively affects the performance of the solar cell. Therefore, the P-type doped layer 5 has a lower doping concentration, thereby reducing the negative impact caused by the long-process high-temperature process. A decrease in the doping concentration of the P-type doped layer 5 causes a slight increase in its sheet resistance. Based on the foregoing discussion, a distance between adjacent P-type fingers 6 may be smaller, which can further improve the efficiency of the solar cell. When the distance between adjacent P-type fingers 6 is less than the distance between adjacent N-type fingers, a difference between the two distances is not specifically limited. It should be noted that a material of the P-type finger 6 is not specifically limited, and whether the material of the P-type finger 6 is the same as the material of the N-type finger is not specifically limited either. For example, the P-type finger 6 may be a silver finger.

It should be noted that, when the distance between adjacent P-type fingers 6 is less than the distance between adjacent N-type fingers, a line width of the P-type finger 6 may be properly reduced, to make light shielding brought by the P-type fingers 6 approximately equal relative to a case that the distance between adjacent P-type fingers 6 is equal to the distance between adjacent N-type fingers. For example, in the present application, when the distance between adjacent P-type fingers 6 is equal to the distance between adjacent N-type fingers, the line width of the P-type finger 6 may range from 30 μm to 35 μm. For another example, in the present application, when the distance between adjacent P-type fingers 6 is less than the distance between adjacent N-type fingers, the line width of the P-type finger 6 may range from 25 μm to 30 μm. In some embodiments, it may be learned from FIG. 5 that, when the distance between adjacent P-type fingers 6 is less than 1.391 mm, each performance of the solar cell is relatively good, and the efficiency of the solar cell is relatively high, reaching 26% or higher. For example, the distance between adjacent P-type fingers 6 may be: 1.296 mm, 1.213 mm, 1.141 mm, 1.076 mm, 1.019 mm, 0.99 mm, 0.977 mm, 0.967 mm, 0.92 mm, 0.878 mm, or 0.839 mm.

In some embodiments, the P-type doped layer 5 is a P-type doped polysilicon layer and/or a P-type doped microcrystalline silicon layer, or a P-type diffusion layer, and the P-type doped layer 5 is diversified.

In some embodiments, the N-type doped layer 1 includes: an N-type doped polysilicon layer and/or an N-type doped microcrystalline silicon layer.

In some embodiments, the distance between adjacent N-type fingers ranges from 0.839 mm to 0.977 mm.

In some embodiments, the distance between adjacent N-type fingers ranges from 0.839 mm to 0.977 mm. Specifically, when the distance between adjacent N-type fingers ranges from 1.019 mm to 1.296 mm, the efficiency of each solar cell is greater than or equal to 26.0%, and the rate at which the efficiency increases is the highest; and when the distance between adjacent N-type fingers ranges from 0.839 mm to 0.977 mm, the efficiency of each solar cell is greater than or equal to 26.0%, and the rate at which the efficiency decreases is the lowest. Therefore, in the present application, the distance between adjacent N-type fingers ranges from 0.839 mm to 0.977 mm. By further optimizing the distance between adjacent N-type fingers, the efficiency of the solar cell is further improved. It should be noted that a material of the N-type finger is not specifically limited. For example, the N-type finger may be a silver finger.

For example, the distance between adjacent N-type fingers may be 0.977 mm, 0.971 mm, 0.967 mm, 0.9 mm, 0.92 mm, 0.913 mm, 0.878 mm, 0.8 mm, or 0.839 mm.

In some embodiments, the N-type doped layer 1 has a doping concentration of $3\times10^{20}$ cm-3 to $7\times10^{20}$ cm-3. Specifically, the doping concentration of the N-type doped layer 1 is an important factor affecting the sheet resistance of the N-type doped layer 1. In the present application, the doping concentration of the N-type doped layer 1 is limited within the foregoing proper range, to cause the sheet resistance of the N-type doped layer 1 to fall within a proper range, so that factors such as parasitic absorption, a recombination current of a metal region, and a transverse resistance can achieve a better balance, thereby achieving better performance of the solar cell and higher photoelectric conversion efficiency.

For example, the doping concentration of the N-type doped layer 1 may be $3\times10^{20}$ cm-3, $3.2\times10^{20}$ cm-3, $3.5\times10^{20}$ cm-3, $4\times10^{20}$ cm-3, $4.3\times10^{20}$ cm-3, $4.7\times10^{20}$ cm-3, $4.21\times10^{20}$ cm-3, $5\times10^{20}$ cm-3, $5.2\times10^{20}$ cm-3, $5.5\times10^{20}$ cm-3, $6\times10^{20}$ cm-3, $6.3\times10^{20}$ cm-3, or $7\times10^{20}$ cm-3.

In some embodiments, a sheet resistance of the N-type doped layer 1 is greater than 20 ohms/square and less than or equal to 40 ohms/square. For the definition of the sheet resistance of the N-type doped layer 1, refer to the foregoing record. To avoid repetition, details are not described herein again. For specific reasons and the like, refer to the foregoing FIG. 2. To avoid repetition, details are not described herein again.

For example, the sheet resistance of the N-type doped layer 1 may be 20.3 ohms/square, 20.7 ohms/square, 21 ohms/square, 21.3 ohms/square, 22 ohms/square, 22.5 ohms/square, 23 ohms/square, 23.5 ohms/square, 24 ohms/square, 24.5 ohms/square, 25 ohms/square, 25.6 ohms/square, 27 ohms/square, 28 ohms/square, 29.6 ohms/square, 30 ohms/square, 31.6 ohms/square, 36.2 ohms/square, 38.56 ohms/square, or 40 ohms/square, and the distance between adjacent N-type fingers may be 0.977 mm, 0.971 mm, 0.967 mm, 0.9 mm, 0.92 mm, 0.913 mm, 0.878 mm, 0.8 mm, or 0.839 mm.

In some embodiments, the sheet resistance of the N-type doped layer 1 ranges from 14 ohms/square to 20 ohms/square, and the distance between adjacent N-type fingers ranges from 1.019 mm to 1.296 mm. For specific reasons and the like, refer to the foregoing FIG. 2. To avoid repetition, details are not described herein again.

For example, the sheet resistance of the N-type doped layer 1 may be 14 ohms/square, 14.7 ohms/square, 15 ohms/square, 15.3 ohms/square, 16 ohms/square, 16.5 ohms/square, 17 ohms/square, 17.7 ohms/square, 18 ohms/square, 18.5 ohms/square, 19 ohms/square, 19.5 ohms/square, or 20 ohms/square, and the distance between adjacent N-type fingers may be 1.019 mm, 1.05 mm, 1.076 mm, 1.112 mm, 1.141 mm, 1.173 mm, 1.213 mm, 1.25 mm, or 1.296 mm.

For another example, the sheet resistance of the N-type doped layer 1 may be 14 ohms/square, 14.7 ohms/square, 15 ohms/square, 16.8 ohms/square, 17.6 ohms/square, 18.5 ohms/square, 19.3 ohms/square, 20.4 ohms/square, 22 ohms/square, 25 ohms/square, 23.1 ohms/square, 29.5 ohms/square, 27 ohms/square, 30 ohms/square, 32.5 ohms/square, 38 ohms/square, 39.1 ohms/square, or 40 ohms/square.

In some embodiments, a sheet resistance of the P-type doped layer 5 ranges from 20 ohms/square to 166 ohms/square. For the definition of the sheet resistance of the P-type doped layer 5, refer to the foregoing related record. To avoid repetition, details are not described herein again. The sheet resistance of the P-type doped layer 5 falling within the range is beneficial to improving the efficiency of the solar cell, for example, causing the efficiency of the solar cell to be greater than or equal to 25.99%. For details, refer to the foregoing FIG. 5 and corresponding related records. To avoid repetition, details are not described herein again.

For example, the sheet resistance of the P-type doped layer 5 may be 20 ohms/square, 20.5 ohms/square, 36 ohms/square. 40 ohms/square, 50 ohms/square, 60 ohms/square, 70 ohms/square, 80 ohms/square, 90 ohms/square, 93 ohms/square, 100 ohms/square, 120 ohms/square, 130 ohms/square, 140 ohms/square, 150 ohms/square, 160 ohms/square, 165 ohms/square, or 166 ohms/square.

In some embodiments, the solar cell further includes: a first tunneling oxide layer 4, formed between the N-type doped layer 1 and the silicon substrate 3. The first tunneling oxide layer 4 and the foregoing N-type doped layer 1 may form a passivated contact structure, thereby further improving the efficiency of the solar cell. In FIG. 7, the first tunneling oxide layer 4 and the N-type doped layer 1 are both disposed on only some regions of the back surface of the silicon substrate, and an electrode is disposed above the layers. In a bifacial TOPCon solar cell, not only Auger recombination and parasitic absorption in a non-electrode contact region need to be reduced, but also a doping amount in an electrode contact region needs to be increased, so as to reduce contact resistance and reduce metal-semiconductor recombination. Therefore, in the solar cell in FIG. 7, the electrode contact region is provided with only a local passivated contact structure. Compared with the solar cell shown in FIG. 6, the non-electrode contact region of the solar cell in FIG. 7 is provided with only the second passivation anti-reflection layer 8, and by reducing a coverage area of the doped layer, the parasitic absorption brought by the N-type doped layer 1 is reduced; and the local passivated contact structure is disposed in the electrode contact region, thereby ensuring a contact effect of the electrode and improving the conversion efficiency of the solar cell. Further, the non-electrode contact region in FIG. 7 may be set to have a textured structure, so as to increase light absorption and improve a bifaciality:

In some embodiments, when the P-type doped layer 5 is a P-type doped polysilicon layer, the solar cell may further include: a second tunneling oxide layer, formed between the P-type doped layer 5 and the silicon substrate 3. The second tunneling oxide layer and the first tunneling oxide layer 4 may be formed in a same process, or the second tunneling oxide layer and the first tunneling oxide layer 4 may be formed in different processes. This is not specifically limited. When the second tunneling oxide layer and the first tunneling oxide layer are formed in different processes, whether the first tunneling oxide layer 4 or the second tunneling oxide layer is first formed is not specifically limited. For example, the first tunneling oxide layer may be first formed, and then the second tunneling oxide layer may be formed.

The solar cell in the second aspect is further explained and described below with reference to specific examples.

Referring to the bifacial TOPCon solar cells shown in FIG. 6 to FIG. 7, the N-type doped layer 1 is an N-type doped polysilicon layer, the N-type doped layer 1 has a thickness of approximately 135 nm, and a distance between adjacent N-type fingers 2 ranges from 0.839 to 0.977 mm, for example, may be approximately 0.92 mm. The distance between adjacent P-type fingers 6 is also in a range of 0.839 to 0.977 mm, but is less than the distance between adjacent N-type fingers 2. For example, the distance between adjacent P-type fingers 6 may be approximately 0.89 mm. The sheet resistance of the N-type doped layer 1 ranges from 14 ohms/square to 45 ohms/square, and may further range from 40 ohms/square to 45 ohms/square, for example, may be 42 ohms/square. The sheet resistance of the P-type doped layer ranges from 200 ohms/square to 500 ohms/square, and may further range from 200 ohms/square to 300 ohms/square, for example, may be 220 ohms/square. A doping concentration of the N-type doped layer ranges from $2\times10^{20}$ cm-3 to $5\times10^{21}$ cm-3. The doping concentration of the heavily-doped part in the P-type doped layer ranges from $3\times10^{18}$ cm-3 to $5\times10^{19}$ cm-3, and the doping concentration of the lightly-doped part in the P-type doped layer ranges from $2\times10^{18}$ cm-3 to $3\times10^{18}$ cm-3. The silicon substrate is an N-type silicon substrate. When the P-type doped layer is a P-type diffusion layer obtained by performing boron diffusion on the silicon substrate, the P-type diffusion layer and the N-type silicon substrate form a PN junction, and a junction depth of the PN junction thereof ranges from approximately 0.5 to 2 μm. It should be noted that, the back surface of the silicon substrate further has an internal diffusion layer, and a depth of the internal diffusion layer ranges from approximately 20 nm to 100 nm. For the back surface of the silicon substrate, the first tunneling oxide layer 4 may have a blocking function on internal diffusion of the N-type doped layer 1 into the silicon substrate. In addition, slight internal diffusion of the N-type doped layer 1 into the silicon substrate may further have functions of performing field passivation, improving a tunneling effect, and reducing a series resistance. In the present application, the mentioned internal diffusion refers to a phenomenon in which a doping element diffuses into the silicon substrate when a diffusion process is performed on the doped layer. In addition, the distribution of the doping concentration of the N-type doped layer 1 is more uniform than the distribution of the doping concentration of the P-type diffusion layer.

It should be noted that, compared with the related art, to improve the current collection efficiency and match the sheet resistances of the P-type doped layer and the N-type doped layer, the distance between the N-type finger and the P-type finger of the solar cell may be further reduced, so that recombination during carrier transport may be reduced, and the number of fingers may be increased. Therefore, the line width of the N-type finger and the P-type finger may be properly reduced. For example, the line width of the N-type finger and the P-type finger may range from 20 μm to 30 μm. Even if the number of fingers is increased, the light shielding area brought by the N-type finger and the P-type finger is substantially equal to that brought before the number of fingers is increased. For example, in the present application, the line width of the N-type finger and the P-type finger may be 25 μm, the distance between adjacent N-type fingers 2 is 0.92 mm, and the distance between adjacent P-type fingers 6 is 0.89 mm.

In some embodiments, there is also a ratio relationship between a line width of fingers and a distance between adjacent fingers of the same polarity. When a ratio of a distance between adjacent fingers of the same polarity to a line width of fingers ranges from 20 to 49, and may further range from 20 to 37, disposition of fingers can satisfy a transport requirement, and can also ensure that a light shielding area is as small as possible, thereby improving current collection efficiency. For example, in the present application, the line width of the fingers is 28 μm, the distance between adjacent N-type fingers is 0.92 mm, and the ratio of the distance between adjacent N-type fingers to the line width of the fingers is 32.85, thereby improving the collection efficiency of the solar cell. For another example, a ratio of a distance between adjacent fingers of the same polarity to a line width of fingers may be 20, 21, 22, 23, 24, 25, 26, 27, 28, 29, 30, 31, 32, 33, 34, 35, 36, or 37.

The following describes the solar cell of the third aspect. For related parts of the solar cell of the third aspect, refer to related records of the solar cells of the foregoing first aspect and second aspect. To avoid repetition, only differences from the solar cells of the first aspect and the second aspect are described.

Figure 8:
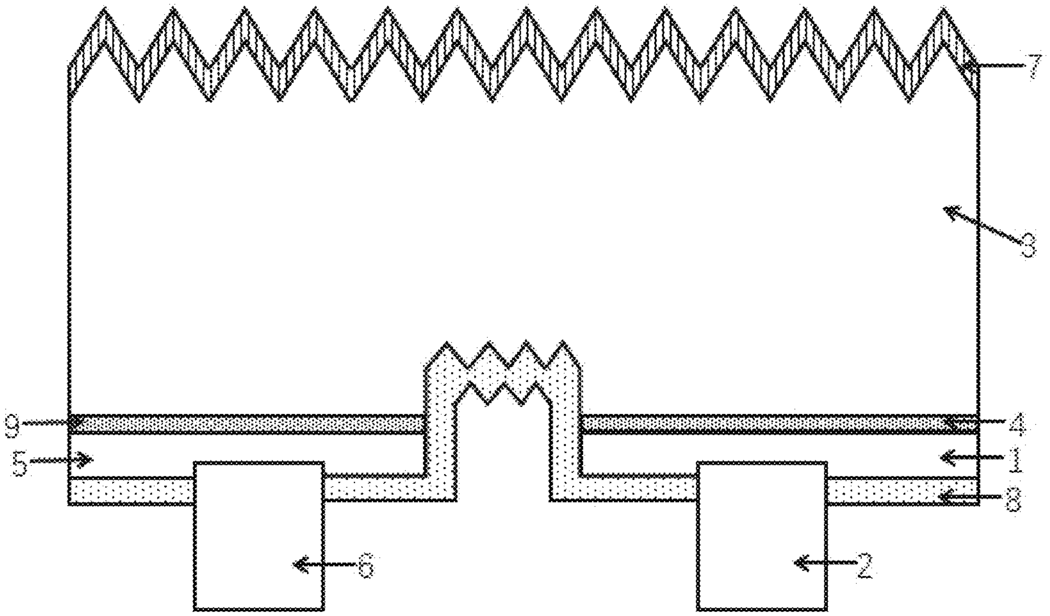

Referring to FIG. 8, the solar cell of the third aspect includes: a silicon substrate 3, an N-type doped layer 1, a P-type doped layer 5, and N-type fingers. The silicon substrate 3 includes a light-receiving surface and a back surface that are opposite to each other; and the back surface has: a first conductive region and a second conductive region that are distributed at an interval. An interval between the first conductive region and the second conductive region is used for avoiding electric leakage, and relative sizes of the first conductive region and the second conductive region are not limited. The N-type doped layer 1 is formed on the first conductive region; and the P-type doped layer 5 is formed on the second conductive region. Therefore, the solar cell is a back contact solar cell. The light-receiving surface of the silicon substrate 3 in the solar cell is not covered by an electrode, which has higher efficiency. A sheet resistance of the P-type doped layer 5 ranges from 20 ohms/square to 166 ohms/square, which is beneficial to improving efficiency of the solar cell. A sheet resistance of the N-type doped layer 1 is greater than 14 ohms/square and less than or equal to 40 ohms/square. The N-type fingers distributed at intervals and in parallel are formed on a side of the N-type doped layer 1 facing away from the silicon substrate 3. The distance between adjacent N-type fingers is less than 1.391 mm, and the sheet resistance of the N-type doped layer 1 and the distance between adjacent N-type fingers are respectively within the foregoing ranges, so that factors such as parasitic absorption, a recombination current of a metal region, and a transverse resistance can achieve a better balance, thereby achieving better performance of the solar cell and higher photoelectric conversion efficiency.

For example, the sheet resistance of the N-type doped layer 1 may be 14 ohms/square, 14.7 ohms/square, 15 ohms/square, 16.8 ohms/square, 17.6 ohms/square, 18.5 ohms/square, 19.3 ohms/square, 20.4 ohms/square, 22 ohms/square, 25 ohms/square, 23.1 ohms/square, 29.5 ohms/square, 27 ohms/square, 30 ohms/square, 32.5 ohms/square, 38 ohms/square, 39.1 ohms/square, or 40 ohms/square, and the distance between adjacent N-type fingers may be 1.296 mm, 1.213 mm, 1.141 mm, 1.076 mm, 1.019 mm, 1 mm, 0.977 mm, 0.967 mm, 0.92 mm, 0.878 mm, 0.839 mm, or 0.8 mm.

More specifically, FIG. 2 is a curve graph of impact of a sheet resistance of an N-type doped layer 1 and a distance between adjacent N-type fingers on efficiency of a solar cell. For example, referring to FIG. 2, a horizontal coordinate in FIG. 2 indicates a sheet resistance of an N-type doped layer 1 such as an N-type doped polysilicon layer or a phosphorus-doped polysilicon layer, a vertical coordinate in FIG. 2 indicates efficiency of the solar cell, and curves from bottom to top in FIG. 2 sequentially correspond to the following distances between adjacent N-type fingers: a total of 15 distances of 1.964 mm, 1.78 mm, 1.628 mm, 1.5 mm, 1.391 mm, 1.296 mm, 1.213 mm, 1.141 mm, 1.076 mm, 1.019 mm, 0.977 mm, 0.967 mm, 0.92 mm, 0.878 mm, and 0.839 mm. In FIG. 2, a solar cell whose efficiency is greater than or equal to 26%, for example, 26.0% to 26.5%, is selected as a relatively efficient solar cell, that is, a part bounded by a dashed box in FIG. 2, and efficiency of each solar cell corresponding to a part below the dashed box is less than 26%. It may be learned from FIG. 2 that, efficiency of each of solar cells corresponding to distances between adjacent N-type fingers greater than or equal to 1.391 mm being such 5 distances as 1.964 mm, 1.78 mm, 1.628 mm, 1.5 mm, and 1.391 mm among the foregoing 15 distances between adjacent N-type fingers, and/or the sheet resistance of the N-type doped layer 1 being less than 14 ohms/square or greater than 40 ohms/square is less than 26%, indicating that when the distance between adjacent N-type fingers is greater than or equal to 1.391 mm, and/or the sheet resistance of the N-type doped layer 1 is less than 14 ohms/square or greater than 40 ohms/square, the solar cell cannot obtain good efficiency. Therefore, in the present application, the distance between adjacent N-type fingers being less than 1.391 mm and the sheet resistance of the N-type doped layer 1 ranging from 14 ohms/square to 40 ohms/square are selected, which is beneficial to improvement of efficiency of a solar cell. As shown in FIG. 2, in the present application, if the distance between adjacent N-type fingers being less than 1.391 mm and the sheet resistance of the N-type doped layer 1 ranging from 14 ohms/square to 40 ohms/square are selected, efficiency of the solar cell is greater than or equal to 26%, and even reaches 26.5% or higher.

Referring to FIG. 2, the sheet resistance of the N-type doped layer 1 is 20 ohms/square, and is approximately a sheet resistance of the N-type doped layer 1 corresponding to an inflection point of the efficiency in a part whose efficiency is greater than or equal to 26%. More specifically, when the sheet resistance of the N-type doped layer 1 ranges from 14 ohms/square to 20 ohms/square, the distance between adjacent N-type fingers ranges from 1.019 mm to 1.296 mm, the efficiency of each solar cell is greater than or equal to 26.0%, and the rate at which the efficiency increases is the highest. In some embodiments, when the sheet resistance of the N-type doped layer 1 is greater than 20 ohms/square and less than or equal to 40) ohms/square, the distance between adjacent N-type fingers ranges from 0.839 mm to 0.977 mm, the efficiency of each solar cell is greater than or equal to 26.0%, and the rate at which the efficiency decreases is the lowest. Therefore, in the present application, the sheet resistance of the N-type doped layer 1 ranges from 14 ohms/square to 20 ohms/square, and the distance between adjacent N-type fingers ranges from 1.019 mm to 1.296 mm; or the sheet resistance of the N-type doped layer 1 is greater than 20 ohms/square and less than or equal to 40 ohms/square, and the distance between adjacent N-type fingers ranges from 0.839 mm to 0.977 mm. The sheet resistance of the N-type doped layer 1 and the distance between adjacent N-type fingers are further combined and optimized, thereby further improving the efficiency of the solar cell.

For example, the sheet resistance of the N-type doped layer 1 may be 14 ohms/square, 14.7 ohms/square, 15 ohms/square, 15.3 ohms/square, 16 ohms/square, 16.5 ohms/square, 17 ohms/square, 17.7 ohms/square, 18 ohms/square, 18.5 ohms/square, 19 ohms/square, 19.5 ohms/square, or 20 ohms/square, and the distance between adjacent N-type fingers may be 1.019 mm, 1.05 mm, 1.076 mm, 1.112 mm, 1.141 mm, 1.173 mm, 1.213 mm, 1.25 mm, or 1.296 mm. Alternatively, the sheet resistance of the N-type doped layer 1 may be 20.3 ohms/square, 20.7 ohms/square, 21 ohms/square, 21.3 ohms/square, 22 ohms/square, 22.5 ohms/square, 23 ohms/square, 23.5 ohms/square, 24 ohms/square, 24.5 ohms/square, 25 ohms/square, 25.6 ohms/square, 27 ohms/square, 28 ohms/square, 29.6 ohms/square, 30 ohms/square, 31.6 ohms/square, 36.2 ohms/square, 38.56 ohms/square, or 40 ohms/square, and the distance between adjacent N-type fingers may be 0.977 mm, 0.971 mm, 0.967 mm, 0.9 mm, 0.92 mm, 0.913 mm, 0.878 mm, 0.8 mm, or 0.839 mm.

In some embodiments, the N-type doped layer 1 has a doping concentration of $3\times10^{20}$ cm-3 to $7\times10^{20}$ $cm^{-3}$. Specifically, the doping concentration of the N-type doped layer 1 is an important factor affecting the sheet resistance of the N-type doped layer 1. In the present application, the doping concentration of the N-type doped layer 1 is limited within a relatively proper range, so that the sheet resistance of the N-type doped layer 1 can fall within the foregoing required range.

For example, the doping concentration of the N-type doped layer 1 may be $3\times10^{20}$ cm-3, $3.2\times10^{20}$ cm-3, $3.5\times10^{20}$ cm-3, $4\times10^{20}$ cm-3, $4.3\times10^{20}$ cm-3, $4.7\times10^{20}$ cm-3, $4.21\times10^{20}$ cm-3, $5\times10^{20}$ cm-3, $5.2\times10^{20}$ cm-3, $5.5\times10^{20}$ cm-3, $6\times10^{20}$ cm-3, $6.3\times10^{20}$ cm-3, or $7\times10^{20}$ cm-3.

The solar cell further includes: a plurality of P-type fingers 6 distributed at intervals and in parallel, formed on a side of the P-type doped layer 5 facing away from the silicon substrate 3. A distance between adjacent P-type fingers 6 is less than or equal to the distance between adjacent N-type fingers, which can further improve the efficiency of the solar cell. For example, the distance between adjacent P-type fingers 6 is equal to the distance between adjacent N-type fingers; or the distance between adjacent P-type fingers 6 is less than the distance between adjacent N-type fingers.

In some embodiments, it may be learned from FIG. 5 that, when the distance between adjacent P-type fingers 6 is less than 1.391 mm, each performance of the solar cell is relatively good, and the efficiency of the solar cell is relatively high, reaching 26% or higher. For example, the distance between adjacent P-type fingers 6 may be: 1.296 mm, 1.213 mm, 1.141 mm, 1.076 mm, 1.019 mm, 0.99 mm, 0.977 mm, 0.967 mm, 0.92 mm, 0.878 mm, or 0.839 mm.

In some embodiments, the solar cell further includes: a first tunneling oxide layer 4, formed between the N-type doped layer 1 and the silicon substrate 3; and a second tunneling oxide layer 9, formed between the P-type doped layer 5 and the silicon substrate 3. The second tunneling oxide layer 9 and the first tunneling oxide layer 4 may be formed in a same process, or the second tunneling oxide layer 9 and the first tunneling oxide layer 4 may be formed in different processes. This is not specifically limited. When the second tunneling oxide layer 9 and the first tunneling oxide layer 4 are formed in different processes, whether the first tunneling oxide layer 4 or the second tunneling oxide layer 9 is first formed is not specifically limited. For example, the first tunneling oxide layer 4 may be first formed, and then the second tunneling oxide layer 9 may be formed.

In some embodiments, an interval between the first conductive region and the second conductive region is used for avoiding electric leakage, and relative sizes of the first conductive region and the second conductive region are not limited.

In some embodiments, the N-type doped layer 1 is an N-type doped polysilicon layer, the P-type doped layer is a P-type doped polysilicon layer, and the thickness of the P-type doped layer 5 is greater than or equal to the thickness of the N-type doped layer 1. Specifically, it may be difficult for the P-type doped layer 5 to obtain a relatively high doping concentration, and the P-type doped layer 5 has a higher sheet resistance. To reduce the sheet resistance, the P-type doped layer 5 has a properly larger thickness, thereby further improving the efficiency of the solar cell. For example, the P-type doped layer 5 may have a thickness of 100 nm to 500 nm, and further may have a thickness of 200 nm to 400 nm, for example, 300 nm. For another example, the N-type doped layer 1 may have a thickness of 80 nm to 400 nm, and further 150 nm to 300 nm, for example, 200 nm.

The solar cell in the third aspect is further explained and described below with reference to specific examples.

Referring to the TBC (TOPCon-Back Contact) solar cell shown in FIG. 8, the N-type doped layer 1 is an N-type doped polysilicon layer, and the N-type doped layer 1 has a thickness of 100 nm to 400 nm, and for example, may be approximately 200 nm. The P-type doped layer 5 is a P-type doped polysilicon layer, and the P-type doped layer 5 may have a thickness of 100 nm to 500 nm, for example, 300 nm. The distance between adjacent N-type fingers 2 and the distance between adjacent P-type fingers 6 are both in a range of 0.839 to 0.977 mm, and for example, may be approximately 0.92 mm. The sheet resistance of the N-type doped layer 1 ranges from 14 ohms/square to 50 ohms/square, and may further range from 20 ohms/square to 40 ohms/square, for example, may be 24 ohms/square. The sheet resistance of the P-type doped layer ranges from 50 ohms/square to 200 ohms/square, or the sheet resistance of the P-type doped layer ranges from 50 ohms/square to 120 ohms/square, for example, may be 90 ohms/square. The doping concentration of the N-type doped layer ranges from $2\times10^{20}$ $cm^{-3}$ to $7\times10^{21}$ $cm^{-3}$, for example, $6\times10^{20}$ $cm^{-3}$. The doping concentration of the P-type doped layer when being heavily doped ranges from $2\times10^{19}$ $cm^{-3}$ to $5\times10^{20}$ $cm^{-3}$, for example, $6\times10^{19}$ $cm^{-3}$; and the doping concentration of the P-type doped layer when being lightly doped ranges from $2\times10^{18}$ $cm^{-3}$ to $5\times10^{19}$ $cm^{-3}$, for example, $6\times10^{18}$ $cm^{-3}$. The silicon substrate is an N-type silicon substrate, a degree of internal diffusion of the N-type doped layer 1 into the silicon substrate is stronger than a degree of internal diffusion of the P-type doped layer into the silicon substrate. For example, internal diffusion of the N-type doped layer 1 into the silicon substrate ranges from approximately $10^{17}$ $cm^{-3}$ to $8\times10^{20}$ $cm^{-3}$, and internal diffusion of the P-type doped layer into the silicon substrate ranges from approximately 1016 $cm^{-3}$ to $5\times10^{19}$ $cm^{-3}$.

Other film layers in the solar cell of the third aspect are not limited. For example, reference may be made to the description of other film layers in the solar cell of the foregoing first aspect. Specific parameter ranges of other layers or structures in the solar cell of the second aspect are not limited. For example, reference may also be further made to related records in the solar cell of the first aspect.

In some embodiments, there is a proportional relationship between the finger width of the solar cell and the width of the N-type doped layer or the P-type doped layer. When a ratio of the width of the N-type doped layer or the P-type doped layer to the finger width falls within a range of 10 to 35, not only a carrier transport requirement can be satisfied, and costs of preparing the finger can be reduced, but also the contact performance between the doped layer and the electrode can be improved. For a TBC solar cell, when the N-type substrate is a silicon substrate, the P-type doped layer and the N-type substrate form an emitter junction. To ensure generation of carriers, the width of the P-type doped layer is greater than the width of the N-type doped layer. Therefore, a ratio of the width of the P-type doped layer to the finger width is slightly greater than a ratio of the width of the N-type doped layer to the finger width. For example, the ratio of the width of the N-type doped layer or the P-type doped layer to the finger width may be 10, 11, 12, 13, 14, 15, 16, 17, 18, 19, 20, 21, 22, 23, 24, 25, 26, 27, 28, 29, 30, 31, 32, 33, 34, or 35.

It should be noted that, each of the solar cells of the first aspect, the second aspect, and the third aspect at least aims at enabling factors such as parasitic absorption, a recombination current of a metal region, and a transverse resistance in the back contact solar cell to achieve a better balance, thereby achieving better performance of the solar cell and higher photoelectric conversion efficiency. Therefore, the solar cells belong to the same application concept.

The present application further provides a photovoltaic module, where the photovoltaic module includes a plurality of solar cell strings, the solar cell string includes a plurality of solar cells and a plurality of interconnection members, and the interconnection members are configured to connect the plurality of solar cells in series; and the solar cells include a plurality of solar cells according to any one of the foregoing aspects, and the photovoltaic module may further include other structures. For example, the photovoltaic module may further include encapsulation adhesive films formed on two opposite sides of the solar cell. The other structures of the photovoltaic module are not specifically limited. The photovoltaic module has the same or similar beneficial effects as those of any one of the foregoing solar cells. To avoid repetition, details are not described herein. The interconnection members may include: a soldering strip, a conductive interconnection member, and the like. The interconnection members electrically connect a positive electrode of a former solar cell and a negative electrode of a latter solar cell of two adjacent solar cells, to connect the two adjacent solar cells in series.

It needs to be noted that for ease of description, the method embodiments are stated as a combination of a series of actions. However, a person skilled in the art should be aware that the embodiments of the present application are not limited to the described action sequence, because according to the embodiments of the present application, some steps can be performed in another sequence or simultaneously. In addition, a person skilled in the art should also be aware that the embodiments described in the description are all preferred embodiments, and the actions involved are not necessarily required by the embodiments of the present application.

The invention claimed is:

1. A solar cell, comprising:

a silicon substrate, wherein the silicon substrate comprises a first surface and a second surface that are opposite to each other, and wherein the first surface is a back surface of the silicon substrate;

an N-type doped layer, located on at least part of the first surface, wherein a sheet resistance of the N-type doped layer ranges from 14 ohms/square to 40 ohms/square; and a plurality of N-type fingers distributed at intervals and in parallel and located on a side of the N-type doped layer facing away from the silicon substrate, wherein a distance between adjacent N-type fingers of the plurality of N-type fingers is less than 1.391 mm, wherein a doping concentration of the N-type doped layer ranges from $3\times10^{20}$ $cm^{-3}$ to $7\times10^{20}$ $cm^{-3}$.

2. The solar cell according to claim 1, wherein the sheet resistance of the N-type doped layer ranges from 14 ohms/square to 20 ohms/square, and the distance between adjacent N-type fingers ranges from 1.019 mm to 1.296 mm.

3. The solar cell according to claim 1, wherein a thickness of the N-type doped layer ranges from 100 nm to 140 nm.

4. The solar cell according to claim 1, further comprising:

a P-type doped layer, wherein a sheet resistance of the P-type doped layer ranges from 20 ohms/square to 166 ohms/square; and a plurality of P-type fingers distributed at intervals and in parallel and located on a side of the P-type doped layer facing away from the silicon substrate.

5. The solar cell according to claim 4, wherein the N-type doped layer comprises at least one of an N-type doped polysilicon layer and an N-type doped microcrystalline silicon layer, wherein the solar cell further comprises a first tunneling oxide layer located between the N-type doped layer and the silicon substrate, and wherein a distance between adjacent P-type fingers of the plurality of P-type fingers is less than or equal to the distance between adjacent N-type fingers.

6. The solar cell according to claim 5, wherein the first surface comprises:

a first conductive region and a second conductive region that are distributed at an interval, wherein:

the N-type doped layer is located on the first conductive region; and the P-type doped layer is located on the second conductive region, and wherein the solar cell further comprises a second tunneling oxide layer located between the P-type doped layer and the silicon substrate.

7. The solar cell according to claim 5, wherein the N-type doped layer is located on the first surface, and the P-type doped layer is located on the second surface.

8. The solar cell according to claim 4, wherein the P-type doped layer comprises at least one of a P-type doped polysilicon layer and a P-type doped microcrystalline silicon layer.

9. The solar cell according to claim 1, wherein the sheet resistance of the N-type doped layer is greater than 20 ohms/square and less than or equal to 40 ohms/square, and the distance between adjacent N-type fingers ranges from 0.839 mm to 0.977 mm.

10. A photovoltaic module, comprising:

a plurality of solar cell, wherein each solar cell of the plurality of solar cell comprises:

a silicon substrate, wherein the silicon substrate comprises a first surface and a second surface that are opposite to each other, and wherein the first surface is a back surface of the silicon substrate;

an N-type doped layer, located on at least part of the first surface, wherein a sheet resistance of the N-type doped layer ranges from 14 ohms/square to 40 ohms/square; and a plurality of N-type fingers distributed at intervals and in parallel and located on a side of the N-type doped layer facing away from the silicon substrate, wherein a distance between adjacent N-type fingers of the plurality of N-type fingers is less than 1.391 mm, wherein a doping concentration of the N-type doped layer ranges from $3\times10^{20}$ $cm^{-3}$ to $7\times10^{20}$ $cm^{-3}$.

* * * * *